(12) United States Patent
Kim et al.

(10) Patent No.: US 12,733,304 B2
(45) Date of Patent: Sep. 8, 2026

(54) DISPLAY DEVICE AND MANUFACTURING METHOD FOR THE SAME

(71) Applicant: Samsung Display Co., LTD., Yongin-si (KR)

(72) Inventors: Jin Taek Kim, Yongin-si (KR); Hyun Kim, Yongin-si (KR); Jeong Su Park, Yongin-si (KR); Jong Chan Lee, Yongin-si (KR); Woong Hee Jeong, Yongin-si (KR); Jung Eun Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 831 days.

(21) Appl. No.: 17/960,205

(22) Filed: Oct. 5, 2022

(65) Prior Publication Data

US 2023/0327055 A1 Oct. 12, 2023

(30) Foreign Application Priority Data

Apr. 12, 2022 (KR) ........................ 10-2022-0045345

(51) Int. Cl.

*H10H 20/85* (2025.01)
*H10H 20/01* (2025.01)
*H10H 20/831* (2025.01)
*H10W 90/00* (2026.01)

(52) U.S. Cl.

CPC ...... *H10H 20/8506* (2025.01); *H10H 20/831* (2025.01); *H10W 90/00* (2026.01); *H10H 20/036* (2025.01)

(58) Field of Classification Search

CPC .... H10H 29/37; H10H 20/036; H10H 20/819; H10H 20/831; H10H 20/8506; H10H 20/857; H10H 29/842; H10H 29/142; H10H 29/012; H10H 20/00; H10H 20/84; H10H 20/032; H10H 20/83; H10H 20/852; H10W 90/00; G09G 2300/0426; G09G 2300/0439; G09G 3/32; G09G 3/3233; H01L 25/0753; H01L 25/167; H01L 2924/12041; H10D 86/60; H10D 86/40; H10D 86/021; H05K 2201/10106

See application file for complete search history.

(56) References Cited

U.S. PATENT DOCUMENTS

| | | | |
|---|---|---|---|
| 7,888,867 | B2 | 2/2011 | Yoshida et al. |
| 9,653,518 | B2 | 5/2017 | Kim |
| 2021/0159250 | A1 | 5/2021 | Chang et al. |

(Continued)

FOREIGN PATENT DOCUMENTS

| | | |
|---|---|---|
| JP | 4540747 | 9/2010 |
| KR | 10-2016-0119351 | 10/2016 |

(Continued)

*Primary Examiner* — Mark W Tornow
*Assistant Examiner* — Priya M Rampersaud
(74) *Attorney, Agent, or Firm* — Womble Bond Dickinson (US) LLP

(57) ABSTRACT

A display device includes a first electrode and a second electrode on a base layer; a first insulating layer on the first electrode and the second electrode; a bank on the first insulating layer; a light emitting element in an area surrounded by the bank; and a second insulating layer on the bank. The second insulating layer forms an opening exposing a surface of the bank.

11 Claims, 21 Drawing Sheets

(56) References Cited

U.S. PATENT DOCUMENTS

| | | | | |
|---|---|---|---|---|
| 2021/0242381 | A1 | 8/2021 | Lee et al. | |
| 2021/0288217 | A1* | 9/2021 | Li | H10W 90/00 |
| 2021/0305222 | A1* | 9/2021 | Min | H10W 90/00 |
| 2021/0399040 | A1* | 12/2021 | Chai | H10H 29/142 |
| 2022/0013693 | A1* | 1/2022 | Cho | H10H 20/019 |
| 2022/0037302 | A1* | 2/2022 | Kim | G09G 3/32 |
| 2022/0045244 | A1* | 2/2022 | Yoo | H10H 20/84 |
| 2022/0052108 | A1* | 2/2022 | Park | H10H 29/142 |
| 2022/0139319 | A1* | 5/2022 | Oh | G09G 3/3233<br>345/204 |
| 2023/0055222 | A1* | 2/2023 | Jeong | H10H 20/8316 |

FOREIGN PATENT DOCUMENTS

| | | | | |
|---|---|---|---|---|
| KR | 10-2021-0065238 | | 6/2021 | |
| KR | 10-2021-0098313 | A | 8/2021 | |
| KR | 10-2021-0103602 | A | 8/2021 | |
| WO | WO-2021162180 | A1 * | 8/2021 | H01L 25/0753 |

* cited by examiner

FIG. 2

LD
EP1
14
11
12
INF
13
EP2

FIG. 7

ALE: ALE1, ALE2, ALE3
ELT1: ELT1_1, ELT1_2
BNK: BNK1, BNK2
BNK1: BNK1_1, BNK1_2

FIG. 8

INS1
VIA
PSV
ILD
BFL
BSL
A'
INS2
BNK1_2
100
T1
1200
ALE3
T2
1400
INS4
ELT1_2
INS3
LD
ELT2
INS2
T3
BNK2
ALE2
INS3
LD
ELT1_1
INS2
BNK1_1
T2
1400
100
T1
ALE1
1200
CH
A
LEL
PCL
DR3
ALE: ALE1, ALE2, ALE3
ELT: ELT1, ELT2
ELT1: ELT1_1, ELT1_2
BNK: BNK1, BNK2
BNK1: BNK1_1, BNK1_2

FIG. 13

INS1'
VIA
PSV
ILD
BFL
BSL
A'
ALE3
ALE2
ALE1
ALE: ALE1, ALE2, ALE3
A
PCL
DR3

FIG. 14

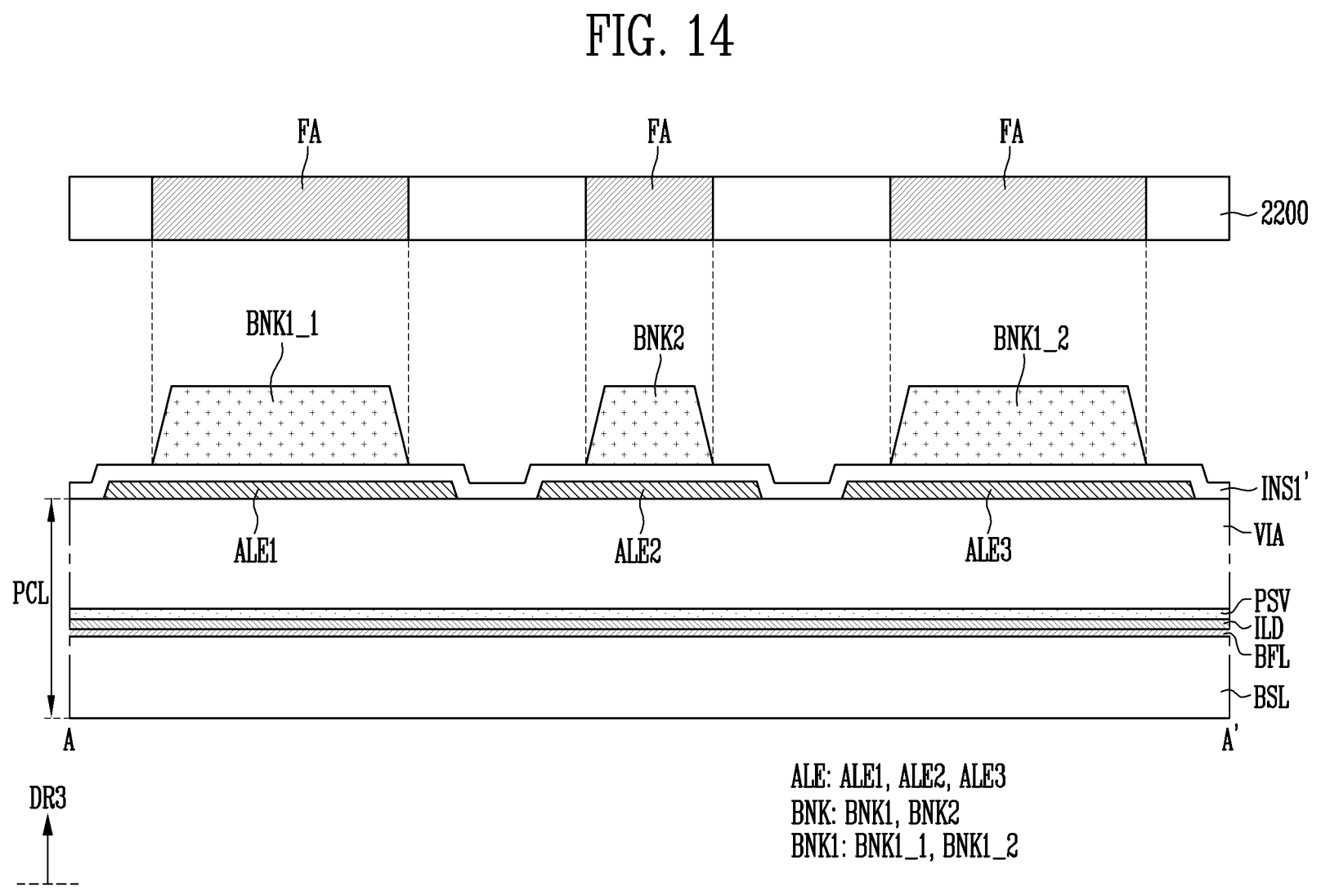

2200
FA
FA
FA
BNK1_2
BNK2
BNK1_1
INS1'
VIA
PSV
ILD
BFL
BSL
A'
A
ALE3
ALE2
ALE1
PCL
DR3

ALE: ALE1, ALE2, ALE3
BNK: BNK1, BNK2
BNK1: BNK1_1, BNK1_2

FIG. 15

INS2'
INS1'
VIA
PSV
ILD
BFL
BSL
A'
BNK1_2
ALE3
BNK2
ALE2
BNK1_1
ALE1
A
PCL
DR3

ALE: ALE1, ALE2, ALE3
BNK: BNK1, BNK2
BNK1: BNK1_1, BNK1_2

FIG. 16

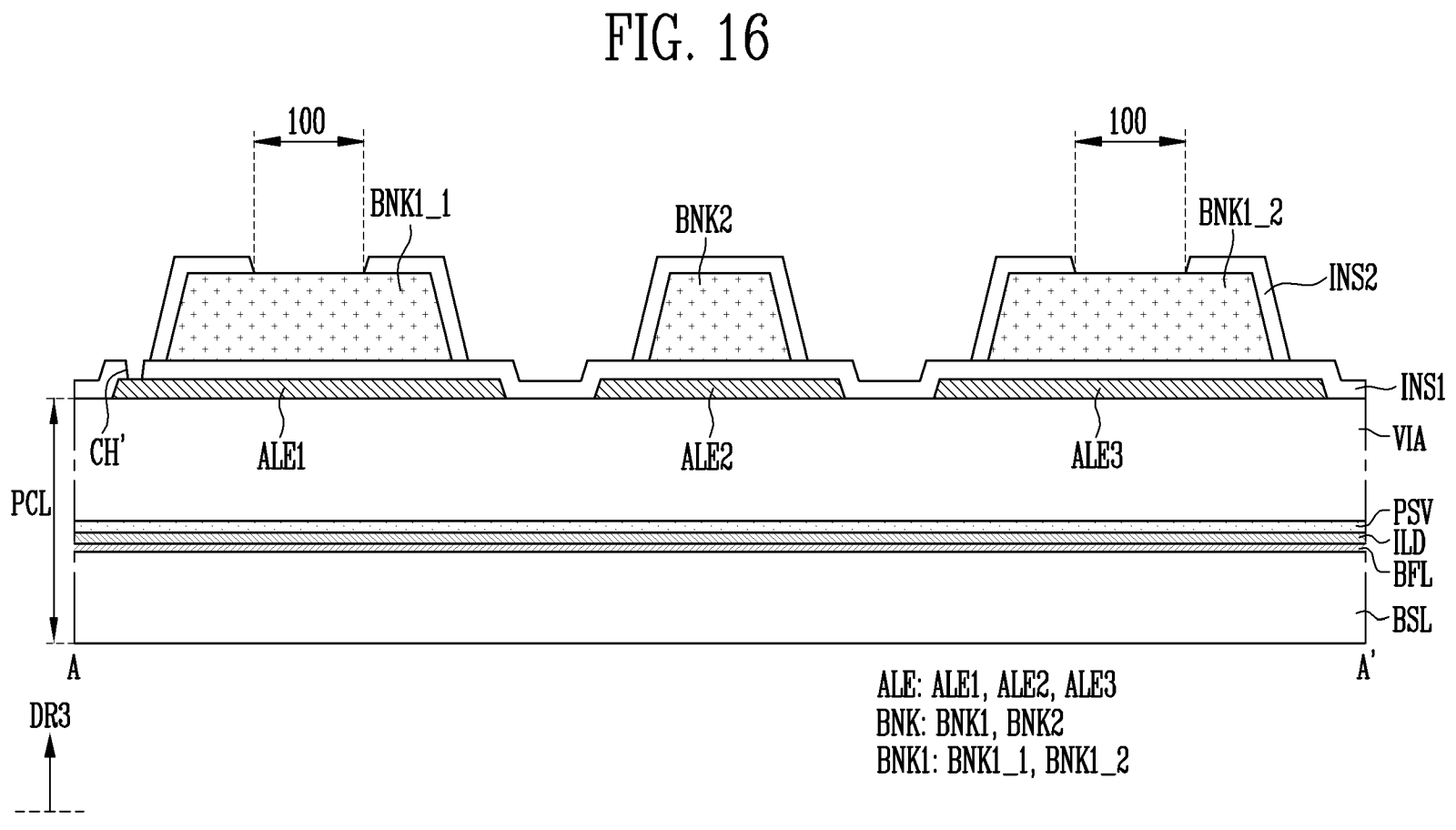

INS1
VIA
PSV
ILD
BFL
BSL
A'
INS2
BNK1_2
100
ALE3
BNK2
ALE2
BNK1_1
100
ALE1
CH'
A
PCL
DR3

ALE: ALE1, ALE2, ALE3
BNK: BNK1, BNK2
BNK1: BNK1_1, BNK1_2

700
710
SLV
LD
LD
BNK1_1
BNK1_2
BNK2
INS2
INS1
VIA
PSV
ILD
BFL
BSL
A'
A
100
100
ALE1
ALE2
ALE3
CH
PCL
DR3
ALE: ALE1, ALE2, ALE3
BNK: BNK1, BNK2
BNK1: BNK1_1, BNK1_2
INK: SLV, LD

FIG. 18

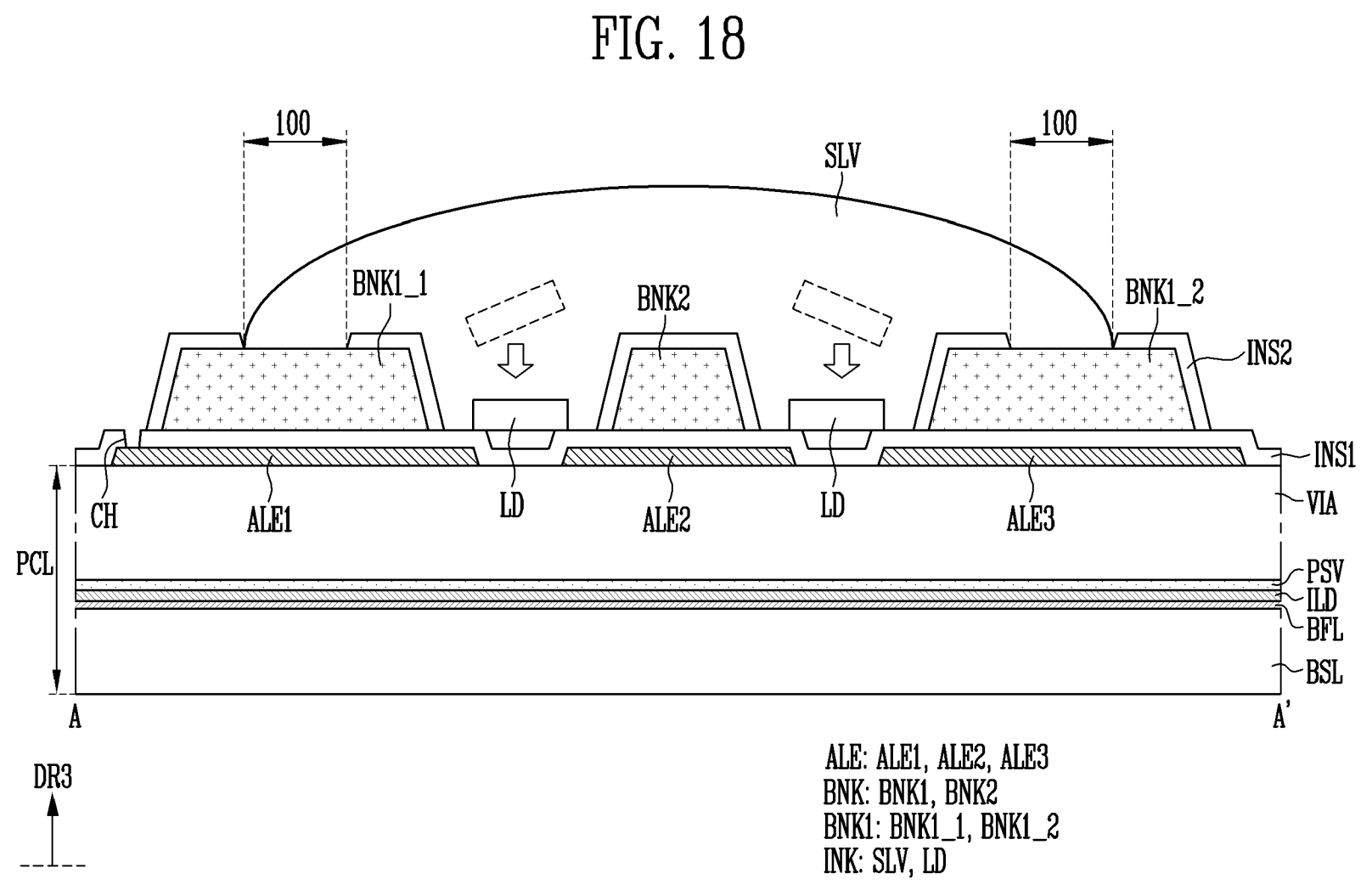

INS1
VIA
PSV
ILD
BFL
BSL
A'
INS2
BNK1_2
100
ALE3
SLV
LD
BNK2
ALE2
LD
BNK1_1
100
ALE1
CH
A
PCL
DR3

ALE: ALE1, ALE2, ALE3
BNK: BNK1, BNK2
BNK1: BNK1_1, BNK1_2
INK: SLV, LD

INS1
VIA
PSV
ILD
BFL
BSL
A'
INS2
BNK1_2
ALE3
ELT1_2
INS3
LD
ELT2
BNK2
ALE2
INS3
LD
ELT1_1
BNK1_1
ALE1
CH
A
PCL
DR3
ALE: ALE1, ALE2, ALE3
BNK: BNK1, BNK2
BNK1: BNK1_1, BNK1_2

2400
FA
HA
HA
HA
FA
INS1'
VIA
PSV
ILD
BFL
BSL
A'
A
BNK1_2
BNK1_1
BNK2
T1
T2
T3
ALE1
ALE2
ALE3
1200
1400
PCL
DR3
ALE: ALE1, ALE2, ALE3
BNK: BNK1, BNK2
BNK1: BNK1_1, BNK1_2

700
710
SLV
LD
LD
BNK2
ALE2
BNK1_2
INS2
INS1
VIA
PSV
ILD
BFL
BSL
A'
100
1200
1400
ALE3
BNK1_1
INS2
ALE1
A
LEL
PCL
DR3
ALE: ALE1, ALE2, ALE3
BNK: BNK1, BNK2
BNK1: BNK1_1, BNK1_2
INK: SLV, LD

DISPLAY DEVICE AND MANUFACTURING METHOD FOR THE SAME

CROSS-REFERENCE TO RELATED APPLICATION(S)

This application claims priority to and benefits of Korean patent application No. 10-2022-0045345 under 35 U.S.C. § 119 filed on Apr. 12, 2022 in the Korean Intellectual Property Office, the entire contents of which are incorporated herein by reference.

BACKGROUND

1. Technical Field

The disclosure generally relates to a display device and a manufacturing method for the same.

2. Description of the Related Art

Recently, as interest in information displays is increased, research and development of display devices have been continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device and a manufacturing method for a display device, in which an alignment degree of light emitting elements can be improved, and processes can be simplified.

In accordance with an aspect of the disclosure, there is provided a display device that may include a first electrode and a second electrode disposed on a base layer; a first insulating layer disposed on the first electrode and the second electrode; a bank disposed on the first insulating layer; a light emitting element disposed in an area surrounded by the bank; and a second insulating layer disposed on the bank, wherein the second insulating layer forms an opening exposing a surface of the bank.

The opening may surround at least a portion of the area including the light emitting element in a plan view.

The bank may protrude in a thickness direction of the base layer, and form a step difference adjacent to the area including the light emitting element.

The bank may include a first bank and a second bank. The opening may overlap the first bank, and may not overlap the second bank. The first bank may include a (1_1)th bank and a (1_2)th bank. The second bank may be disposed between the (1_1)th bank and the (1_2)th bank.

The first bank may include a first bank area having a first thickness and a second bank area having a second thickness. The second thickness may be less than the first thickness. The second bank area may be more adjacent to the light emitting element than the first bank area.

The display device may further include a connection electrode electrically connected to the light emitting element. The connection electrode may be electrically connected to the first electrode through a contact hole penetrating the first insulating layer, and may electrically contact the bank through the opening formed by the second insulating layer.

At least a portion of the surface of the bank may be recessed and forms a cavity in an area overlapping the opening formed by the second insulating layer in a plan view.

The cavity and the second insulating layer may not overlap each other in a plan view.

The bank may include an organic material, and the second insulating layer may include an inorganic material.

The first insulating layer and the second insulating layer may include a same material.

In accordance with the disclosure, there is provided a method for manufacturing a display device, the method may include disposing a first electrode and a second electrode on a base layer; disposing a first base insulating layer on the first electrode and the second electrode; forming a bank on the first base insulating layer; disposing a second base insulating layer that covers at least a portion of the bank; providing a first insulating layer by etching the first base insulating layer; providing a second insulating layer by etching the second base insulating layer; providing an ink including a light emitting element on the base layer; and aligning the light emitting element between the first electrode and the second electrode, wherein the providing of the second insulating layer may include forming an opening exposing at least a portion of the bank, and, in the providing of the ink, the ink is accommodated in a space defined by the bank, based on a position of the opening of the second insulating layer.

The opening may surround at least a portion of an area including the light emitting element in a plan view.

In the disposing of the second base insulating layer, an outer surface of the bank may be covered by the first base insulating layer and the second base insulating layer.

In the providing of the ink, an edge of an area in which the ink is supplied may correspond to the position of the opening of the second insulating layer.

The aligning may of the light emitting element between the first electrode and the second electrode may include supplying a first alignment signal to the first electrode; and supplying a second alignment signal to the second electrode.

The forming of the bank may include forming a base bank layer on the first base insulating layer; forming a photoresist layer on the base bank layer; preparing an etching mask by patterning the photoresist layer, using a binary mask including a full-tone area; and etching the base bank layer by using the etching mask. In the preparing of the etching mask, the full-tone area of the binary mask may correspond to an area including the bank.

The bank may include a first bank area having a first thickness and a second bank area having a second thickness. The second thickness may be less than the first thickness. The second bank area may be more adjacent to the light emitting element than the first bank area. The forming of the bank may include forming a base bank layer on the first base insulating layer; forming a photoresist layer on the base bank layer; preparing an etching mask by patterning the photoresist layer, using a mask including a full-tone area and a half-tone area; and etching the base bank layer by using the etching mask. In the preparing of the etching mask, the full-tone area of the mask may correspond to an area including the first bank area, and the half-tone area of the mask may correspond to an area including the second bank area.

The method may further include performing a plasma surface treatment process on the bank and the second insulating layer such that a surface of the bank corresponding to the opening, has a hydrophobic property as compared with the second insulating layer.

The providing of the first insulating layer and the providing of the second insulating layer may be performed through a same process.

In accordance with the disclosure, there is provided a display device that may include electrodes disposed on a base layer; a first insulating layer disposed on the electrodes; a light emitting element on the first insulating layer; a bank on the first insulating layer; and a second insulating layer disposed on a side surface of the bank facing the light emitting element, wherein the second insulating layer is not disposed on at least a portion of a top surface of the bank, and the bank forms a step difference adjacent to the light emitting element.

BRIEF DESCRIPTION OF THE DRAWINGS

The above and other aspects and features of the disclosure will become more apparent by describing in detail embodiments thereof with reference to the attached drawings, in which:

FIG. 2 is a schematic sectional view illustrating the light emitting element in accordance with an embodiment.

FIG. 7 is a view illustrating a sub-pixel in accordance with an embodiment, and is a schematic sectional view taken along line A-A' shown in FIG. 5.

FIG. 8 is a schematic sectional view taken along line B-B' shown in FIG. 5.

FIGS. 12 to 21 are process sectional views schematically illustrating a manufacturing method for the display device in accordance with an embodiment.

DETAILED DESCRIPTION OF THE EMBODIMENTS

Figure 1:
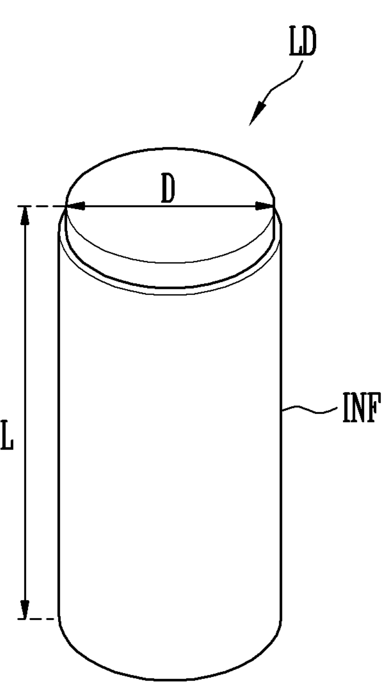
FIG. 1 is a schematic perspective view illustrating a light emitting element in accordance with an embodiment.

The disclosure may be applied to various changes and shapes and may thus modified in different forms. Therefore, examples are not limited to certain shapes but apply to all the changes and equivalent materials and replacements.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be further understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Further, an expression that an element such as a layer, region, substrate or plate is placed "on" or "above" another element indicates not only a case where the element is placed "directly on" or "just above" the other element but also a case where a further element or elements is/are interposed between the element and the other element.

On the contrary, an expression that an element such as a layer, region, substrate or plate is placed "beneath" or "below" another element indicates not only a case where the element is placed "directly beneath" or "just below" the other element but also a case where a further element is interposed between the element and the other element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The disclosure generally relates to a display device. Hereinafter, a display device and a manufacturing method for the same in accordance with an embodiment will be described with reference to the accompanying drawings.

Figure 2:
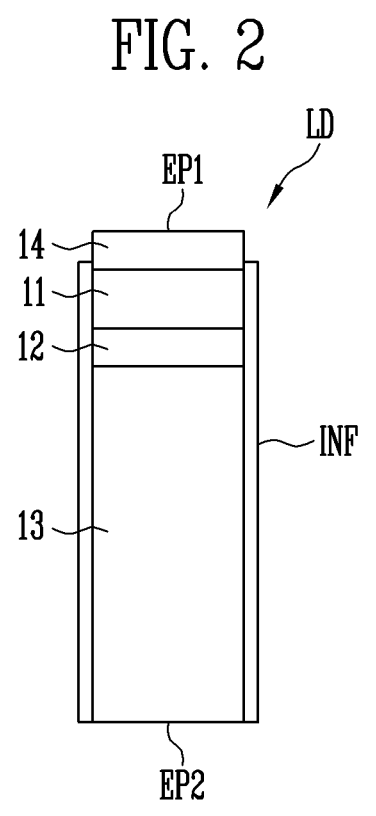

FIG. 1 is a perspective view illustrating a light emitting element in accordance with an embodiment. FIG. 2 is a sectional view illustrating the light emitting element in accordance with an embodiment. Although a pillar-shaped light emitting element LD is illustrated in FIGS. 1 and 2, the kind and/or shape of the light emitting element LD is not limited thereto.

Referring to FIGS. 1 and 2, the light emitting element LD may include a first semiconductor layer 11, an active layer 12, a second semiconductor layer 13, and/or an electrode layer 14.

The light emitting element LD may have various shapes. For example, the light emitting element LD may have a pillar shape extending along one direction or a direction. The light emitting element LD may have a first end portion EP1 and a second end portion EP2. One of the first and second semiconductor layers 11 and 13 may be adjacent to the first end portion EP1 of the light emitting element LD. The other of the first and second semiconductor layers 11 and 13 may be adjacent to the second end portion EP2 of the light emitting element LD. For example, the first semiconductor layer 11 may be adjacent to the first end portion EP1 of the light emitting element LD, and the second semiconductor layer 13 may be adjacent to the second end portion EP2 of the light emitting element LD.

In an embodiment, the light emitting element LD may be a light emitting element manufactured in a pillar shape through an etching process, etc., within the spirit and the scope of the disclosure. In this specification, the term "pillar shape" may include a rod-like shape or bar-like shape, of which aspect ratio is greater than 1, such as a cylinder or a polyprism, and the shape of its section is not particularly limited.

The light emitting element LD may have a size small to a degree of nanometer scale to micrometer scale. In an example, the light emitting element LD may have a diameter D (or width) in a range of nanometer scale to micrometer scale and/or a length L in a range of nanometer scale to micrometer scale. However, the size of the light emitting element LD is not limited thereto, and the size of the light emitting element LD may be variously changed according to design conditions of various types of devices, for example, a display device, and the like, which use, as a light source, a light emitting device using the light emitting element LD.

The first semiconductor layer 11 may be a first conductivity type semiconductor layer. For example, the first semiconductor layer 11 may include a p-type semiconductor layer. In an example, the first semiconductor layer 11 may include at least one semiconductor material among InAlGaN, GaN, AlGaN, InGaN, AlN, and InN, and include a p-type semiconductor layer doped with a first conductivity type dopant such as Mg. However, the material constituting the first semiconductor layer 11 is not limited thereto. Various materials may be included in the first semiconductor layer 11.

The active layer 12 may be disposed between the first semiconductor layer 11 and the second semiconductor layer 13. The active layer 12 may include any one structure among a single well structure, a multi-well structure, a single quantum well structure, a multi-quantum well (MQW) structure, a quantum dot structure, and a quantum wire structure, but the disclosure is not limited thereto. The active layer 12 may include GaN, InGaN, InAlGaN, AlGaN, AlN, or the like, within the spirit and the scope of the disclosure. Various materials may be included in the active layer 12.

If a voltage which is a threshold voltage or more is applied to both ends of the light emitting element LD, the light emitting element LD emits light as electron-hole pairs are combined in the active layer 12. The light emission of the light emitting element LD is controlled by using such a principle, so that the light emitting element LD can be used as a light source for various light emitting devices, including a pixel of a display device.

The second semiconductor layer 13 is formed on the active layer 12, and may include a semiconductor layer having a type different from that of the first semiconductor layer 11. For example, the second semiconductor layer 13 may include an n-type semiconductor layer. In an example, the second semiconductor layer 13 may include any one semiconductor material among InAlGaN, GaN, AlGaN, InGaN, AlN, and InN, and include an n-type semiconductor layer doped with a second conductivity type dopant such as Si, Ge or Sn. However, the material constituting the second semiconductor layer 13 is not limited thereto. Various materials may be included in the second semiconductor layer 13.

The electrode layer 14 may be disposed on the first end portion EP1 and/or the second end portion EP2 of the light emitting element LD. Although a case where the electrode layer 14 is formed on the first semiconductor layer 11 is illustrated in FIG. 2, the disclosure is not necessarily limited thereto. For example, a separate electrode layer may be further disposed on the second semiconductor layer 13.

The electrode layer 14 may include a transparent metal or a transparent metal oxide. In an example, the electrode layer 14 may include at least one of indium tin oxide (ITO), indium zinc oxide (IZO), zinc oxide (ZnO), and zinc tin oxide (ZTO), but the disclosure is not necessarily limited thereto. In case that the electrode layer 14 may be made of a transparent metal or a transparent metal oxide, light generated in the active layer 12 of the light emitting element LD may pass through the electrode layer 14 and be emitted to the outside of the light emitting element LD.

An insulative film INF may be provided on a surface of the light emitting element LD. The insulative film INF may be disposed on or directly disposed on surfaces of the first semiconductor layer 11, the active layer 12, the second semiconductor layer 13, and/or the electrode layer 14. The insulative film INF may expose the first and second end portions EP1 and EP2 of the light emitting element LD, which have different polarities. In an embodiment, the insulative film INF may expose a side portion of the electrode layer 14 and/or the second semiconductor layer 13, adjacent to the first and second end portions EP1 and EP2 of the light emitting element LD.

The insulative film INF may prevent an electrical short circuit which may occur in case that the active layer 12 contacts with a conductive material except the first and second semiconductor layers 11 and 13. Also, the insulative film INF may minimize a surface defect of light emitting elements LD, thereby the lifetime and light emission efficiency of the light emitting elements LD.

The insulative film INF may include at least one selected from the group consisting of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). For example, the insulative film INF may be a double layer, and layers constituting the double layer may include different materials. In an example, the insulative film INF may be a double layer including aluminum oxide ($AlO_x$) and silicon oxide ($SiO_x$), but the disclosure is not limited thereto. In an embodiment, the insulative film INF may be omitted.

A light emitting device including the above-described light emitting element LD may be used in various kinds of devices which require a light source, including a display device. For example, light emitting elements LD may be disposed in each pixel of a display panel, and be used as a light source of each pixel. However, the application field of the light emitting element LD is not limited to the above-described example. For example, the light emitting element LD may be used in other types of devices that require a light source, such as a lighting device.

Figure 3:
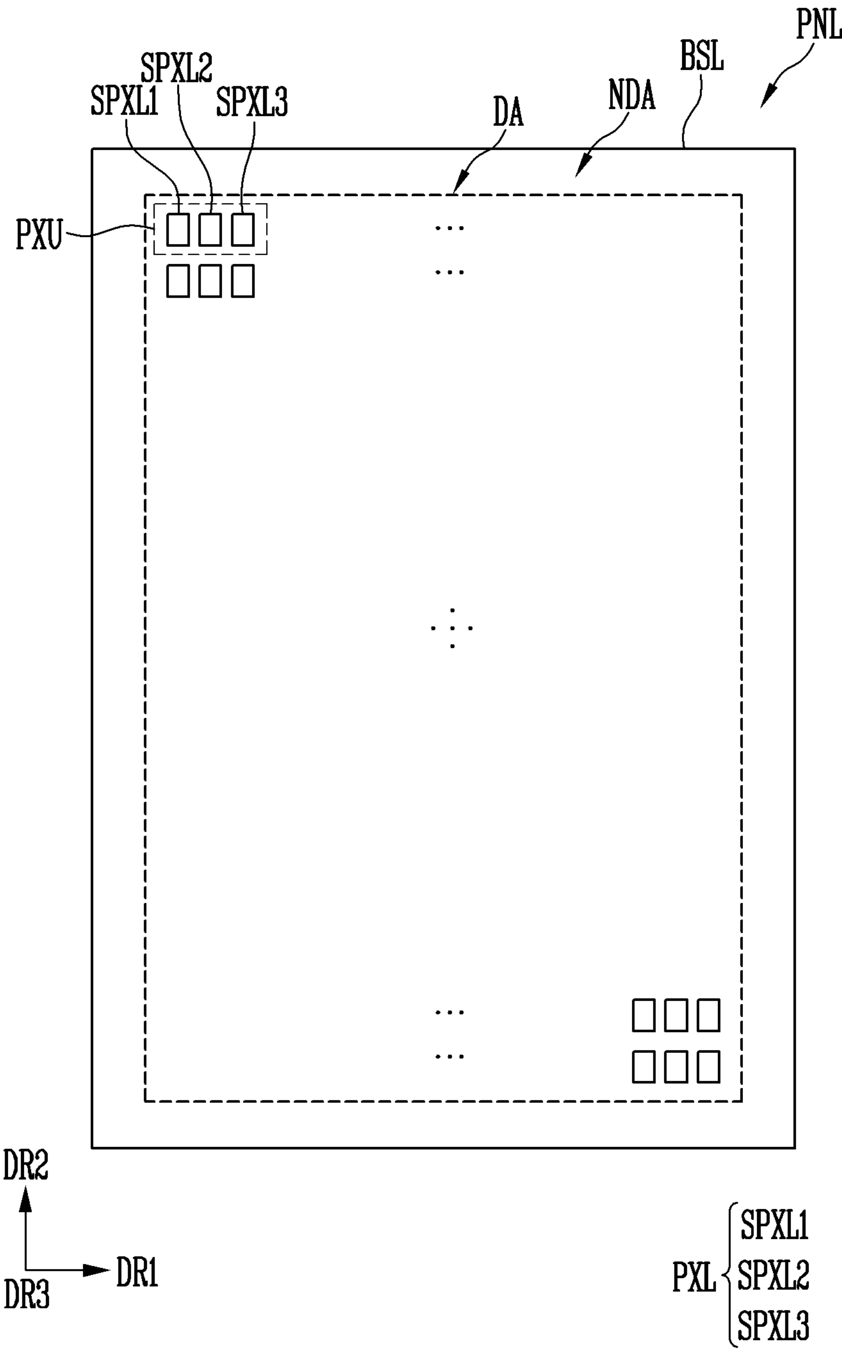
FIG. 3 is a schematic plan view illustrating a display device in accordance with an embodiment.

FIG. 3 is a schematic plan view illustrating a display device in accordance with an embodiment.

In FIG. 3, a display device, particularly, a display panel PNL provided in the display device will be illustrated as an example of an electronic device which can use, as a light source, the light emitting element LD described in the embodiment shown in FIGS. 1 and 2.

For convenience of description, in FIG. 3, a structure of the display panel PNL will be briefly illustrated based on a display area DA. However, in an embodiment, at least one driving circuit (for example, at least one of a scan driver and a data driver), lines, and/or pads, which are not shown in the drawing, may be further disposed in the display panel PNL.

Referring to FIG. 3, the display panel PNL and a base layer BSL for forming the same may include the display area DA for displaying an image and a non-display area NDA except the display area DA. The display area may constitute a screen on which the image is displayed, and the non-display area NDA may be the other area except the display area DA.

A pixel unit PXU may be disposed in the display area DA. The pixel unit PXU may include a first sub-pixel SPXL1, a second sub-pixel SPXL2, and/or a third sub-pixel SPXL3. Hereinafter, in case that at least one pixel among the first sub-pixel SPXL1, the second sub-pixel SPXL2, and the third sub-pixel SPXL3 is arbitrarily designated or in case that two or more kinds of pixels among the first sub-pixel SPXL1, the second sub-pixel SPXL2, and the third sub-pixel SPXL3 are inclusively designated, the corresponding pixel or the corresponding pixels will be referred to as a "pixel PXL" or "pixels PXL."

The pixels PXL may be regularly arranged or disposed according to a stripe structure, a PENTILE™ structure, or the like, within the spirit and the scope of the disclosure. However, the arrangement structure of the pixels PXL is not limited thereto, and the pixels PXL may be arranged in the display area DA in various structures and/or various manners.

In an embodiment, two or more kinds of pixels PXL emitting lights of different colors may be disposed in the display area DA. In an example, first sub-pixels SPXL1 emitting light of a first color, second sub-pixels SPXL2 emitting light of a second color, and third sub-pixels SPXL3 emitting light of a third color may be arranged in the display area DA. At least one first sub-pixel SPXL1, a least one second sub-pixel SPXL2, and at least one third sub-pixel SPXL3, which are disposed adjacent to each other, may constitute one pixel unit PXU to emit lights of various colors. For example, each of the first to third sub-pixels PXL1, PXL2, and PXL3 may be a pixel emitting light of a color. In an embodiment, the first sub-pixel SPXL1 may be a red pixel emitting light of red, the second sub-pixel SPXL2 may be a green pixel emitting light of green, and the third sub-pixel SPXL3 may be a blue pixel emitting light of blue. However, the disclosure is not limited thereto.

In an embodiment, the first sub-pixel SPXL1, the second sub-pixel SPXL2, and the third sub-pixel SPXL3 have light emitting elements emitting light of a same color, and may include color conversion layers and/or color filters of different colors, which are disposed on the respective light emitting elements, to respectively emit lights of the first color, the second color, and the third color. In an embodiment, the first sub-pixel SPXL1, the second sub-pixel SPXL2, and the third sub-pixel SPXL3 respectively have, as light sources, a light emitting element of the first color, a light emitting element of the second color, and a light emitting element of the third color, so that the light emitting elements can respectively emit lights of the first color, the second color, and the third color. However, the color, kind, and/or number of pixels PXL constituting each pixel unit PXU are not particularly limited. In an example, the color of light emitted by each pixel PXL may be variously changed.

The pixel PXL may include at least one light source driven by a control signal (for example, a scan signal and a data signal) and/or a power source (for example, a first power source and a second power source). In an embodiment, the light source may include at least one light emitting element LD in accordance with the embodiment shown in FIGS. 1 and 2, for example, a subminiature pillar-shaped light emitting element LD having a size small to a degree of nanometer scale to micrometer scale. However, the disclosure is not limited thereto. Various types of light emitting elements LD may be used as the light source of the pixel PXL.

In an embodiment, each pixel PXL may be an active pixel. However, the kind, structure, and/or driving method of pixels PXL which can be applied to the display device are not particularly limited. For example, each pixel PXL may be a pixel of a passive or active light emitting display device using various structures and/or driving methods.

Figure 4:
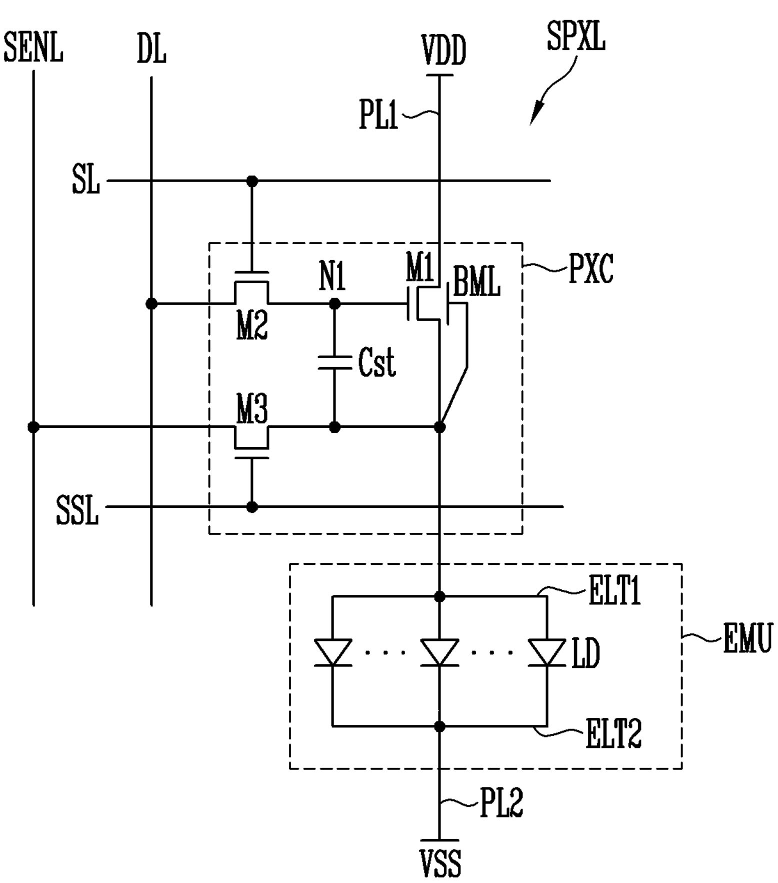
FIG. 4 is a schematic diagram of an equivalent circuit of a pixel in accordance with an embodiment.

FIG. 4 is a schematic diagram of an equivalent circuit of a pixel in accordance with an embodiment. A sub-pixel SPXL in accordance with an embodiment is illustrated in FIG. 4. The sub-pixel SPXL may be one of the first to third sub-pixels SPXL1, SPXL2, and SPXL3. The first sub-pixel SPXL1, the second sub-pixel SPXL2, and the third sub-pixel SPXL3 may have structures substantially identical or similar to one another.

Referring to FIG. 4, the sub-pixel SPXL may include a light emitting unit EMU for generating light with a luminance corresponding to a data signal and a pixel circuit PXC for driving the light emitting unit EMU.

The pixel circuit PXC may be connected between a first power source VDD and the light emitting unit EMU. Also, the pixel circuit PXC may be connected to a scan line SL and a data line DL of the corresponding sub-pixel SPXL, to control an operation of the light emitting unit EMU, corresponding to a scan signal and the data signal, which are supplied from the scan line SL and the data line DL. Also, the pixel circuit PXC may be selectively further connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be connected between the first power source VDD and a first connection electrode ELT1. A gate electrode of the first transistor M1 is connected to a first node N1. The first transistor M1 may control a driving current supplied to the light emitting unit EMU, corresponding to a voltage of the first node N1. For example, the first transistor M1 may be a driving transistor for controlling the driving current of the pixel PXL.

In accordance with an embodiment, the first transistor M1 may include a portion of a lower auxiliary electrode layer BML. The gate electrode of the first transistor M1 and the lower auxiliary electrode layer BML may overlap each other with one insulating layer (for example, a gate insulating layer GI (see FIG. 8)) interposed therebetween. In an embodiment, the lower auxiliary electrode layer BML may be connected to one electrode, for example, a source or drain electrode of the first transistor M1.

In case that the first transistor M1 may include the lower auxiliary electrode layer BML, there may be applied a back-biasing technique (or sync technique) for moving a threshold voltage of the first transistor M1 in a negative direction or positive direction by applying a back-biasing voltage to the lower auxiliary electrode layer BML of the first transistor M1 in driving of the pixel PXL. In an example, a source-sync technique is applied by connecting the lower auxiliary electrode layer BML to a source electrode of the first transistor M1, so that the threshold voltage of the first transistor M1 can be moved in the negative direction or positive direction. In case that the lower auxiliary electrode layer BML is disposed on the bottom of a semiconductor pattern constituting a channel of the first transistor M1, the lower auxiliary electrode layer BML severs as a light blocking pattern, thereby stabilizing operational characteristics of the first transistor M1. However, the function and/or application method of the lower auxiliary electrode layer BML is not limited thereto.

The second transistor M2 may be connected between the data line DL and the first node N1. A gate electrode of the second transistor M2 is connected to the scan line SL. The second transistor M2 is turned on in case that a scan signal having a gate-on voltage (for example, a high level voltage) is supplied from the scan line SL, to connect the data line DL and the first node N1 to each other.

A data signal of a corresponding frame may be supplied to the data line DL for each frame period. The data signal may be transferred to the first node N1 through the turned-on second transistor M2 during a period in which the scan signal having the gate-on voltage is supplied. For example, the second transistor M2 may be a switching transistor for transferring each data signal to the inside of the pixel PXL.

One electrode of the storage capacitor Cst may be connected to the first node N1, and the other electrode of the storage capacitor Cst may be connected to a second electrode of the first transistor M1. The storage capacitor Cst charges a voltage corresponding to the data signal supplied to the first node N1 during each frame period.

The third transistor M3 may be connected between the first connection electrode ELT1 (or the second electrode of the first transistor M1) and the sensing line SENL. A gate electrode of the third transistor M3 may be connected to the sensing signal line SSL. The third transistor M3 may transfer a voltage value applied to the first connection electrode ELT1 to the sensing line SENL according to a sensing signal supplied to the sensing signal line SSL. The voltage value transferred through the sensing line SENL may be provided to an external circuit (for example, a timing controller), and the external circuit may extract characteristic information (for example, the threshold voltage of the first transistor M1, etc.), based on the provided voltage value. The extracted characteristic information may be used to convert image data such that a characteristic deviation between the pixels PXL is compensated.

Although a case where the transistors included in the pixel circuit PXC are all implemented with an n-type transistor has been illustrated in FIG. 4, the disclosure is not limited thereto. For example, at least one of the first, second, and third transistors M1, M2, and M3 may be changed to a p-type transistor.

The structure and driving method of the sub-pixel SPXL may be variously changed in an embodiment. For example, the pixel circuit PXC may be a pixel circuit having various structures and/or various driving methods, in addition to the embodiment shown in FIG. 4.

The light emitting unit EMU may include at least one light emitting element LD, for example, light emitting elements LD connected between the first power source VDD and a second power source VSS.

For example, the light emitting unit EMU may include the first connection electrode ELT1 connected to the first power source VDD through the pixel circuit PXC and a first power line PL1, a second connection electrode ELT2 connected to the second power source VSS through a second power line PL2, and light emitting elements LD connected between the first and second connection electrodes ELT1 and ELT2. The first connection electrode ELT1 may be an anode electrode of the light emitting unit EMU. The second connection electrode ELT2 may be a cathode electrode of the light emitting unit EMU.

The first power source VDD and the second power source VSS may have different potentials such that the light emitting elements LD can emit light. In an example, the first power source VDD may be set as a high-potential power source, and the second power source VSS may be set as a low-potential power source.

In an embodiment, the light emitting unit EMU may include at least one serial stage. The at least one serial stage may include a pair of electrodes (for example, two electrodes) and at least one light emitting element LD connected in a forward direction between the pair of electrodes. The number of serial stages constituting the light emitting unit EMU and the number of light emitting elements LD constituting each serial stage are not particularly limited. In an example, numbers of light emitting elements LD constituting the respective serial stages may be equal to or different from each other.

In case that a driving current is supplied through the corresponding pixel circuit PXC, the light emitting elements LD may emit light with a luminance corresponding to the driving current. For example, during each frame period, the pixel circuit PXC may supply, to the light emitting unit EMU, a driving current corresponding to a grayscale value to be expressed in a corresponding frame. Accordingly, while the light emitting elements LD emit light with the luminance corresponding to the driving current, the light emitting unit EMU can express the luminance corresponding to the driving current.

Hereinafter, a planar structure and a sectional structure of a pixel PXL (or sub-pixel SPXL) in accordance with an embodiment will be described with reference to FIGS. 5 to 11.

First, a pixel PXL (or sub-pixel SPXL) in accordance with an embodiment will be described with reference to FIGS. 5 to 10, and a pixel PXL (or sub-pixel SPXL) in accordance with an embodiment will be described with reference to FIG. 11.

Figure 5:
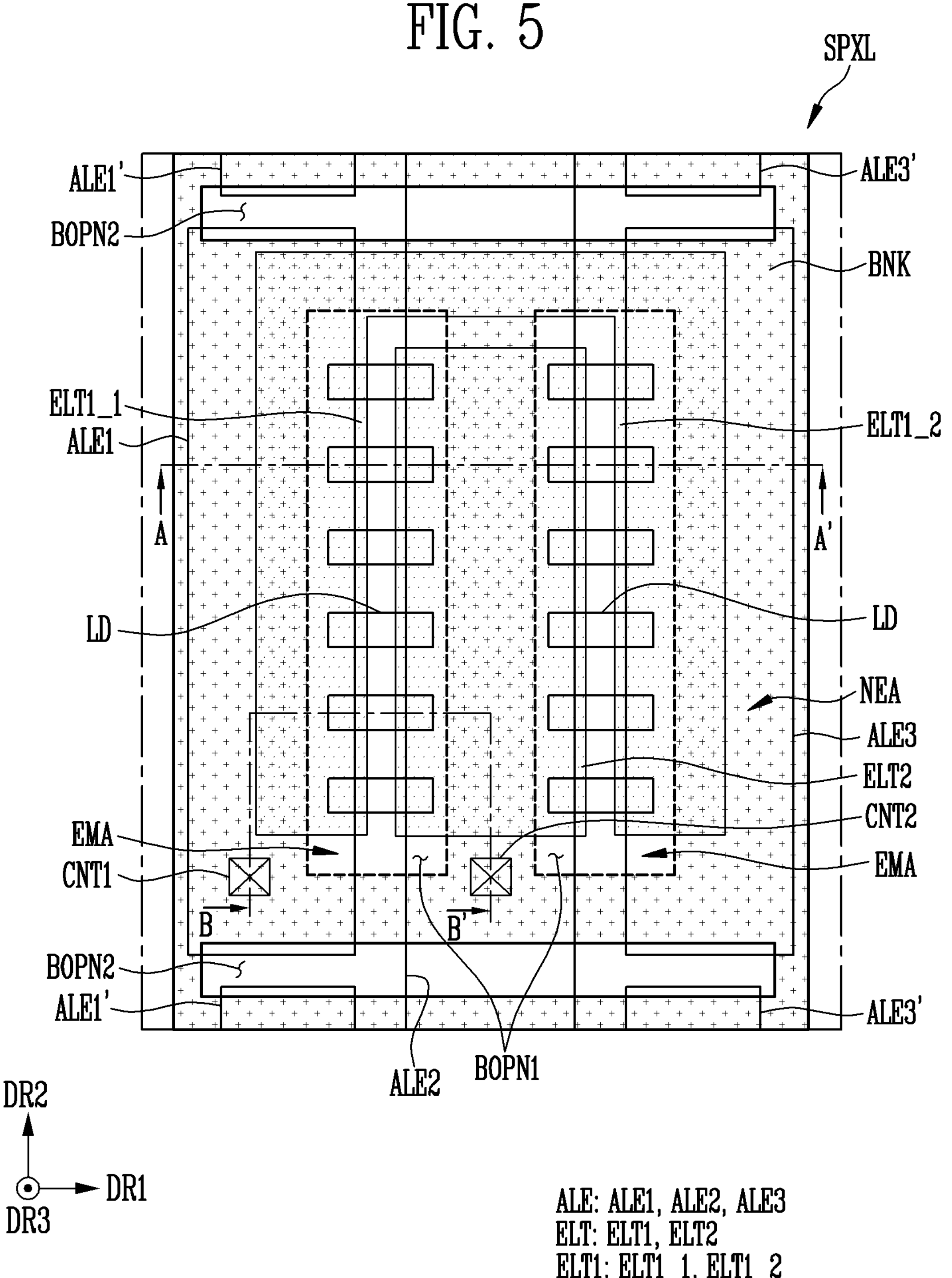
FIG. 5 is a schematic plan view illustrating a sub-pixel in accordance with an embodiment.
Figure 6:
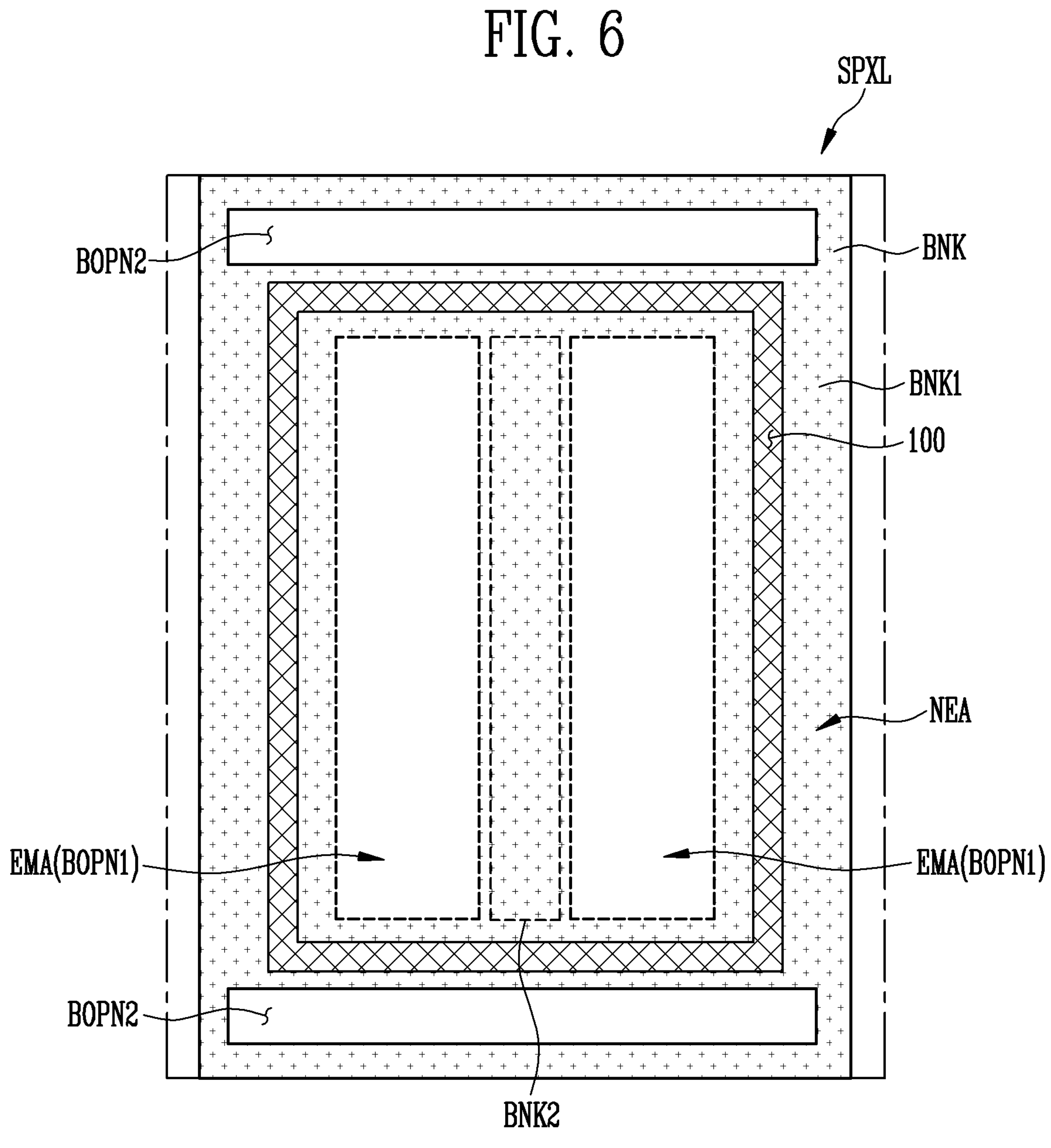
FIG. 6 is a schematic plan view illustrating a sub-pixel in accordance with an embodiment, and is a schematic plan view illustrating an opening which a second insulating layer forms.
Figure 7:
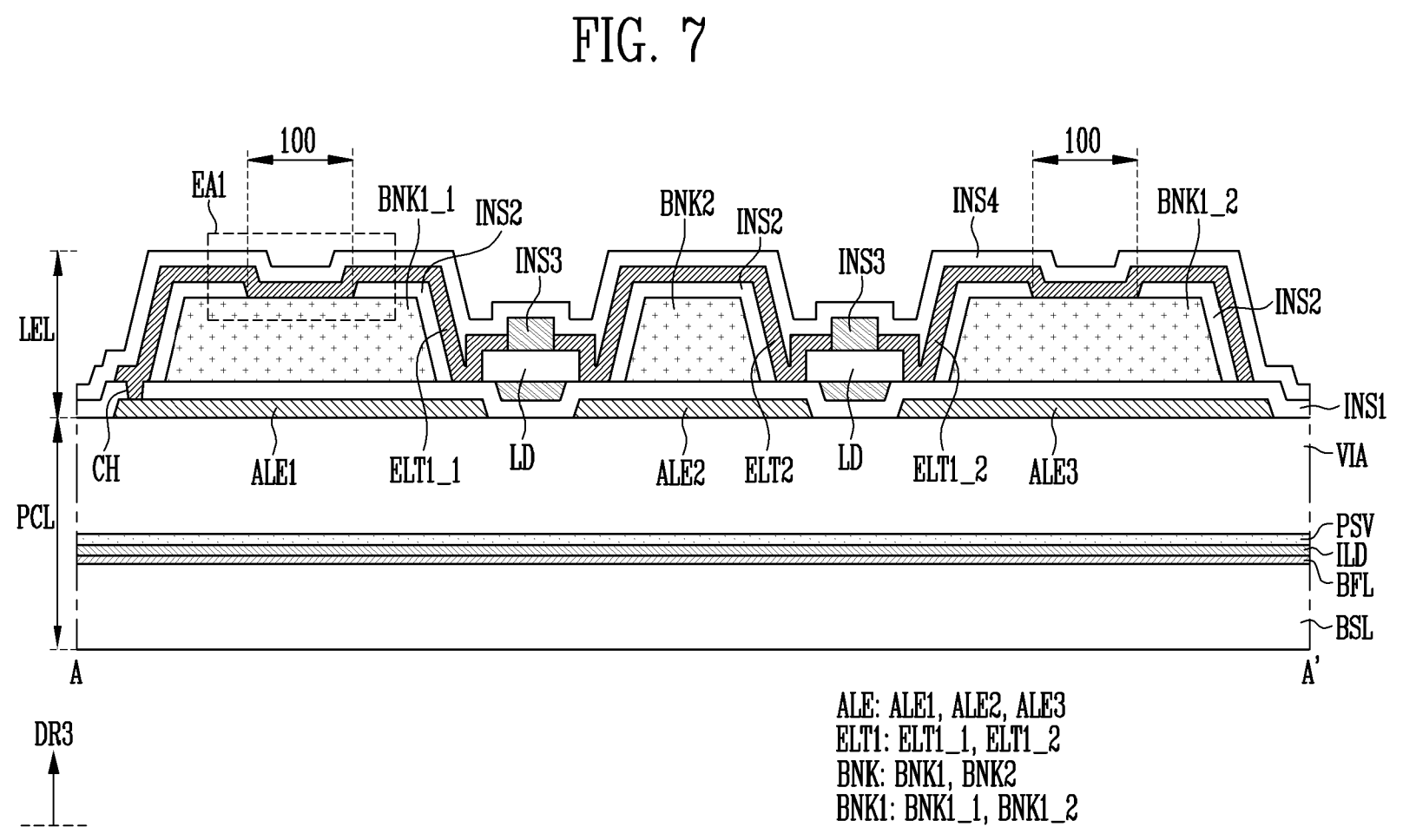
Figure 8:
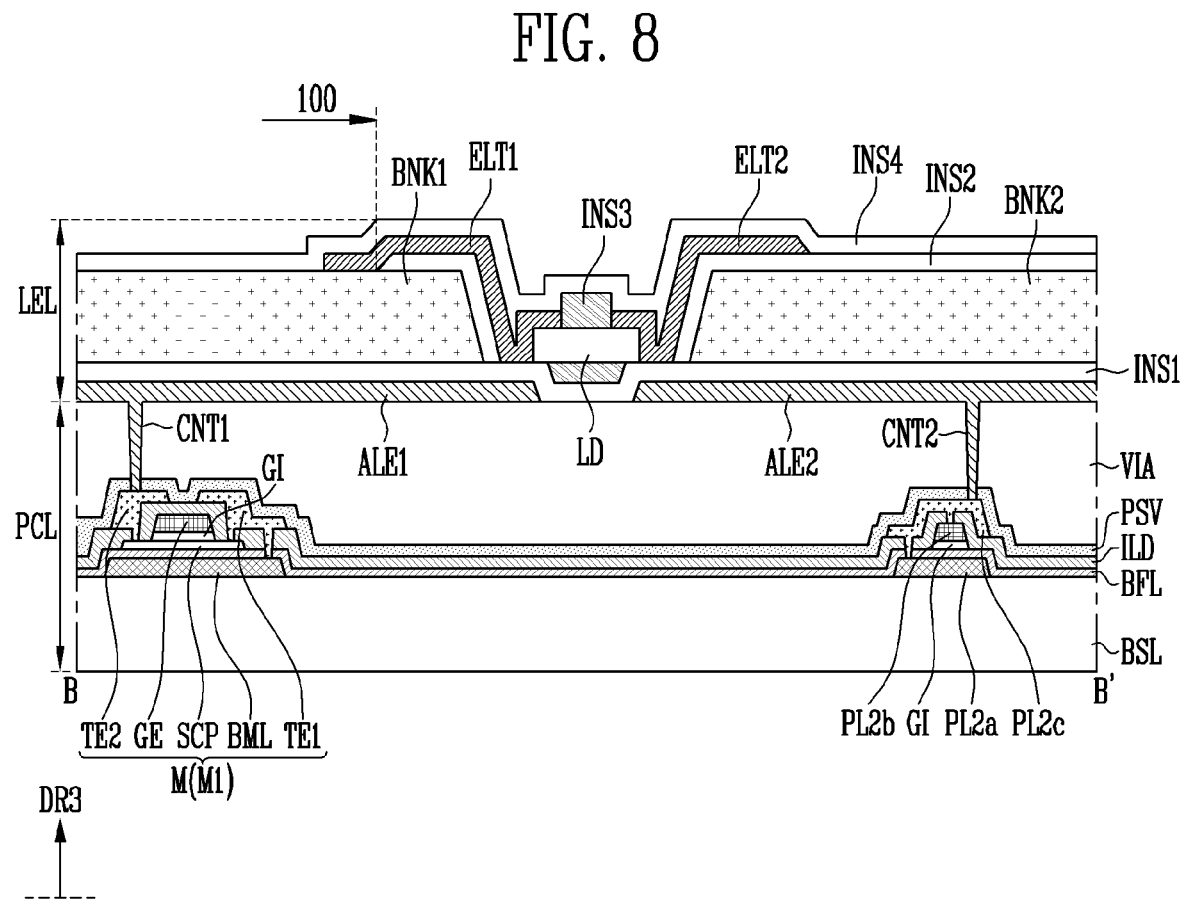
Figure 9:
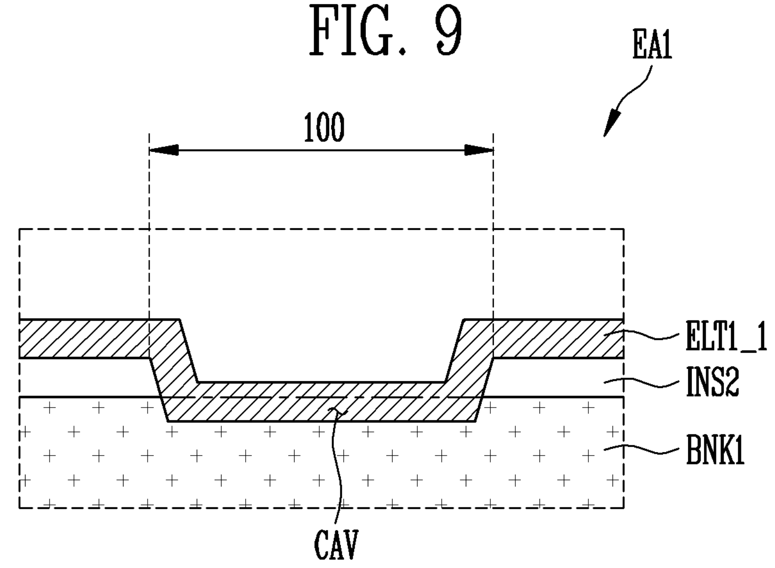
FIG. 9 is a schematic enlarged view of area EA1 shown in FIG. 7.
Figure 10:
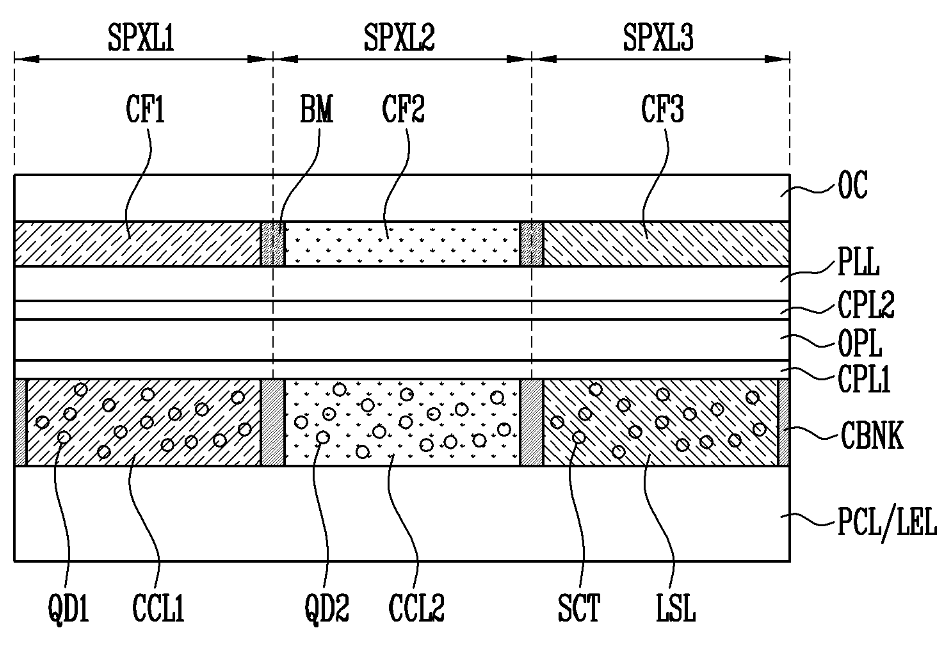
FIG. 10 is a schematic sectional view illustrating first to third sub-pixels in accordance with an embodiment.

FIG. 5 is a schematic plan view illustrating a sub-pixel in accordance with an embodiment. FIG. 6 is a schematic plan view illustrating a sub-pixel in accordance with an embodiment, and is a schematic plan view illustrating an opening which a second insulating layer forms. FIG. 7 is a view illustrating a sub-pixel in accordance with an embodiment, and is a schematic sectional view taken along line A-A' shown in FIG. 5. FIG. 8 is a schematic sectional view taken along line B-B' shown in FIG. 5. FIG. 9 is a schematic enlarged view of area EA1 shown in FIG. 7. FIG. 10 is a schematic sectional view illustrating first to third sub-pixels in accordance with an embodiment.

In an example, FIG. 5 illustrates an area in which a sub-pixel SPXL is disposed. The sub-pixel SPXL shown in FIG. 5 may be one of the first to third sub-pixels SPXL1, SPXL2, and SPXL3 constituting the pixel unit PXU. FIG. 5 illustrates an embodiment including two paths through which light emitting elements LD are disposed, including three electrodes ALE. However, the disclosure is not limited thereto, and the numbers and shapes of the electrodes ALE and the paths may be variously changed.

Referring to FIG. 5, the sub-pixel SPXL may include an emission area EMA and a non-emission area NEA. The emission area EMA may be an area in which a light emitting element LD is disposed to emit light. The non-emission area NEA may be an area in which the light emitting element LD is not disposed. In an embodiment, the emission area EMA may include an area not overlapping a bank BNK in a plan view. The non-emission area NEA may be disposed to surround the emission area EMA. The non-emission area NEA may include an area overlapping the bank BNK in a plan view. The non-emission area NEA may be an area in which the bank BNK is disposed.

The bank BNK may form a bank opening BOPN. For example, the bank opening BOPN may include a first bank opening BOPN1 and a second bank opening BOPN2. For example, the bank BNK may protrude in a direction (for example, a thickness direction of a base layer BSL or a third direction DR3), and be disposed to surround one area or an area (for example, the emission area EMA), thereby forming the bank opening BOPN.

The first bank opening BOPN1 may correspond to a position of the emission area EMA. The first bank opening BOPN1 may expose an area in which the light emitting element LD is to be disposed. In an embodiment, the first bank opening BOPN1 may be provided in plurality. Although an embodiment in which two first bank openings BOPN1 are formed has been illustrated in FIG. 5, the disclosure is not necessarily limited thereto.

The second bank opening BOPN2 may be provided to perform a process for separating adjacent electrodes from each other such that sub-pixels SPXL are individually driven. For example, in the above process, a first electrode ALE1 as an anode electrode of one sub-pixel SPXL may be electrically separated from a first adjacent electrode ALE1' as an anode electrode of another adjacent sub-pixel SPXL. As an example, in the above process, a third electrode ALE3 as an anode electrode of one sub-pixel SPXL may be electrically separated from a third adjacent electrode ALE3' as an anode electrode of another adjacent sub-pixel SPXL.

The bank BNK may form a step difference such that light emitting elements LD can be readily disposed in one area or in an area. For example, as described above, the bank BNK may have a shape protruding in one direction or a direction while being adjacent to the light emitting element LD. Accordingly, in case that light emitting elements LD are supplied, the light emitting elements LD can be readily supplied to the first bank opening BOPN1 formed by the bank BNK.

In accordance with an embodiment, a second electrode ALE2 may be a cathode electrode for providing a cathode signal to the light emitting element LD, and apply a common power source to adjacent sub-pixels SPXL. Accordingly, the second electrode ALE2 may not be separated from another adjacent electrode in an area corresponding to the second bank opening BOPN2. However, the disclosure is not limited to the above-described example.

The sub-pixel SPXL may include electrodes ALE, light emitting elements LD, and connection electrodes ELT.

The electrodes ALE may extend along a second direction DR2. The electrodes ALE may be spaced apart from each other along a first direction DR1. The electrodes ALE may include first to third electrodes ALE1, ALE2, and ALE3. For example, the first to third electrodes ALE1, ALE2, and ALE3 may extend in the second direction DR2. The first to third electrodes ALE1, ALE2, and ALE3 may be spaced apart from each other in the second direction DR2, to be sequentially disposed.

The electrodes ALE may be electrically connected to the pixel circuit PXC and/or one power line. For example, the first electrode ALE1 may be electrically connected to the pixel circuit PXC and/or the first power line PL1 through a first contact part CNT1, and the second electrode ALE2 may be electrically connected to the second power line PL2 through a second contact part CNT2.

The electrodes ALE may be electrically connected to at least some or a number of the connection electrodes ELT through one contact hole. For example, the first electrode ALE1 may be electrically connected to a first connection electrode ELT1 through a contact hole CH. The second electrode ALE2 may be electrically connected to a second connection electrode ELT2 through a contact hole (not shown). The positions and number of contact holes for electrically connecting the electrodes ALE and the connection electrodes ELT to each other are not limited to a specific example.

A pair of electrodes ALE adjacent to each other may be supplied with different signals in a process of aligning the light emitting elements LD. For example, in case that the first to third electrodes ALE1, ALE2, and ALE3 are sequentially arranged along the first direction DR1 in the emission area EMA, the first and second electrodes ALE1 and ALE2 may form a pair to be supplied with different alignment signals, and the second and third electrodes ALE2 and ALE3 may form a pair to be supplied with different alignment signals. The alignment signals may have different waveforms, different potentials, and/or different phases. Accordingly, an electric field is formed between the first and second electrodes ALE1 and ALE2, so that light emitting elements LD can be aligned between the first and second electrodes ALE1 and ALE2. Also, accordingly, an electric field is formed between the second and third electrodes ALE2 and ALE3, so that light emitting elements LD can be aligned between the second and third electrodes ALE2 and ALE3.

In order for the light emitting element LD to emit light, an anode signal may be supplied to the first electrode ALE1, and a cathode signal may be supplied to the second electrode ALE2. The first electrode ALE1 is separated from a first adjacent electrode ALE1' of another adjacent sub-pixel SPXL, so that the sub-pixel SPXL can be individually driven. However, the disclosure is not limited to the above-described example.

Each of the light emitting elements LD may be aligned between a pair of electrodes ALE in the emission area EMA. Also, each of the light emitting elements LD may be electrically connected between a pair of connection electrodes ELT.

For example, a light emitting element LD may be aligned between the first and second electrodes ALE1 and ALE2. The light emitting element LD may be electrically connected between a (1_1)th connection electrode ELT1_1 as a first part of the first connection electrode ELT1 and the second connection electrode ELT2. A light emitting element LD may be aligned between the second and third electrodes ALE2 and ALE3. The light emitting element LD may be electrically connected between a (1_2)th connection electrode ELT1_2 as a second part of the first connection electrode ELT1 and the second connection electrode ELT2.

The connection electrodes ELT may be disposed to overlap at least one electrode ALE and/or at least one light emitting element LD. For example, each connection electrode ELT may be formed on electrodes ALE and/or light emitting elements LD to overlap the electrodes ALE and/or the light emitting elements LD. Therefore, the connection electrode ELT may be electrically connected to the light emitting elements LD. In an embodiment, at least a portion of the first connection electrode ELT1 may be bent.

The planar structure of the sub-pixel SPXL is not necessarily limited to the above-described example, and the sub-pixel SPXL may have various planar structures.

Referring to FIG. 6, an opening 100 formed by a second insulating layer INS2 (see FIG. 7) may be disposed on the bank BNK. For convenience of description, some or s number of components among the components described above with reference to FIG. 5 are omitted. The second insulating layer INS2 is not illustrated such that FIG. 6 is clearly illustrated. The shape of the opening 100 formed by the second insulating layer INS may be understood with reference to FIGS. 6 and 7. The opening 100 is indicated by hatching such that the position of the opening 100 can be clearly described.

The second insulating layer INS2 may expose one surface of the bank BNK. Accordingly, the second insulating layer INS2 may provide the opening 100. The second insulating layer INS2 may not be disposed at a position at which the opening 100 is to be formed.

The opening 100 may overlap the non-emission area NEA in a plan view. The opening 100 may not overlap the emission area EMA (or the first bank opening BOPN1) in a plan view.

The opening 100 may be formed to surround the emission area EMA (or the first bank opening BOPN1) of the sub-pixel SPXL. For example, the opening 100 may surround all sides of the emission area EMA (or the first bank opening BOPN1). The opening 100 may surround at least a portion of each of left, right, top, and bottom sides of the emission area EMA.

In accordance with an embodiment, the bank may include a first bank BNK1 and a second bank BNK2. The first bank BNK1 and the second bank BNK2 may be patterned through a same process, and be disposed in a same layer. The first bank BNK1 may mean the other bank BNK except the second bank BNK2. The second bank BNK2 is a portion of the bank BNK, and may mean the bank BNK disposed between the emission areas EMA adjacent to each other. The opening 100 may not be formed on the second bank BNK2. In an embodiment, the second insulating layer INS2 may be entirely disposed on the second bank BNK2. The second bank BNK2 may be disposed between the first banks BNK1.

In accordance with an embodiment, the opening 100 may be disposed to entirely surround the emission area EMA and the second bank BNK2. In an embodiment, the opening 100 may define a space in which an ink INK (see FIG. 17) provided to perform a process for supplying light emitting elements LD is accommodated. For example, the ink INK for supplying the light emitting elements LD may be entirely disposed in an area surrounded by the opening 100. This will be described in detail later.

Hereinafter, sectional structures of the pixel PXL and the sub-pixel SPXL will be described with reference to FIGS. 7 to 10. FIGS. 7 and 8 illustrate a pixel circuit layer PCL and a light emitting element layer LEL of the sub-pixel SPXL. The first transistor M1 among various circuit elements constituting the pixel circuit PXC is illustrated in FIG. 8. In case that the first to third transistors M1, M2, and M3 are designated without being distinguished from each other, each of the first to third transistors M1, M2, and M3 will be inclusively referred to as a "transistor M." The structure of transistors M and/or the positions of the transistors M for each layer is not limited to the embodiment shown in FIG. 8, and may be variously changed in an embodiment.

Referring to FIGS. 7 and 8, the pixel circuit layer PCL and the light emitting element layer LEL of the sub-pixel SPXL in accordance with an embodiment may include circuit elements including transistors M disposed on a base layer BSL and various lines connected thereto. The light emitting element layer LEL including electrodes ALE, light emitting elements LD, and/or connection electrodes ELT may be disposed on the pixel circuit layer PCL.

The base layer BSL may be a rigid or flexible substrate or a film. In an example, the base layer BSL may be a rigid substrate made of glass or tempered glass, a flexible substrate (or thin film) made of a plastic or metal material, or at least one insulating layer. The material and/or property of the base layer BSL is not particularly limited. In an embodiment, the base layer BSL may be substantially transparent. The term "substantially transparent" may mean that light can be transmitted with a transmittance or more. In an embodiment, the base layer BSL may be translucent or opaque. Also, the base layer BSL may include a reflective material in an embodiment.

A lower auxiliary electrode layer BML and a first power conductive layer PL2*a* may be disposed on the base layer BSL. The lower auxiliary electrode layer BML and the first power conductive layer PL2*a* may be disposed in a same layer. For example, the lower auxiliary electrode layer BML and the first power conductive layer PL2*a* may be simultaneously formed through a same process, but the disclosure is not necessarily limited thereto. The first power conductive layer PL2*a* may constitute the second power line PL2 described with reference to FIG. 4 and the like, within the spirit and the scope of the disclosure.

Each of the lower auxiliary electrode layer BML and the first power conductive layer PL2*a* may be formed as a single layer or a multi-layer, which is made of at least one of molybdenum (Mo), copper (Cu), aluminum (Al), chromium (Cr), gold (Au), titanium (Ti), nickel (Ni), neodymium (Nd), and indium (In), tin (Sn), and any oxide or ally thereof.

A buffer layer BFL may be disposed on the lower auxiliary electrode layer BML and the first power conductive layer PL2*a*. The buffer layer BFL may prevent an impurity from being diffused into each circuit element. The buffer layer BFL may be a single layer, but may also be a multi-layer including at least two layers. In case that the buffer layer BFL is provided as the multi-layer, the layers may be formed of a same material or similar material or be formed of different materials.

A semiconductor pattern SCP may be disposed on the buffer layer BFL. In an example, the semiconductor pattern SCP may include a first region contacting with a first transistor electrode TE1, a second region contacting with a second transistor electrode TE2, and a channel region located or disposed between the first and second regions. In an embodiment, one of the first and second regions may be a source region, and the other of the first and second regions may be a drain region.

In an embodiment, the semiconductor pattern SCP may be made of poly-silicon, amorphous silicon, oxide semiconductor, etc., within the spirit and the scope of the disclosure. The channel region of the semiconductor pattern SCP is a semiconductor pattern undoped with an impurity, and may be an intrinsic semiconductor. Each of the first and second regions of the semiconductor pattern SCP may be a semiconductor pattern doped with an impurity.

A gate insulating layer GI may be disposed on the buffer layer BFL and the semiconductor pattern SCP. In an example, the gate insulating layer GI may be disposed between the semiconductor pattern SCP and a gate electrode GE. Also, the gate insulating layer GI may be disposed between the buffer layer BFL and a second power conductive layer PL2*b*. The gate insulating layer GI may be a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The gate electrode GE of the transistor M and the second power conductive layer PL2*b* may be disposed on the gate insulating layer GI. For example, the gate electrode GE and the second power conductive layer PL2*b* may be disposed in a same layer. For example, the gate electrode GE and the second power conductive layer PL2*b* may be simultaneously formed through a same process, but the disclosure is not necessarily limited thereto. The gate electrode GE may be disposed on the gate insulating layer GI to overlap the semiconductor pattern SCP in the third direction DR3. The second power conductive layer PL2*b* may be disposed on the gate insulating layer GI to overlap the first power conductive layer PL2*a* in the third direction DR3. The second power conductive layer PL2*b* along with the first power conductive layer PL2*a* may constitute the second power line PL2 described with reference to FIG. 4 and the like, within the spirit and the scope of the disclosure.

Each of the gate electrode GE and the second power conductive layer PL2*b* may be formed as a single layer or a multi-layer, which is made of molybdenum (Mo), copper (Cu), aluminum (Al), chromium (Cr), gold (Au), titanium (Ti), nickel (Ni), neodymium (Nd), indium (In), tin (Sn), and any oxide or alloy thereof.

An interlayer insulating layer ILD may be disposed on the gate electrode GE and the second power conductive layer PL2*b*. In an example, the interlayer insulating layer ILD may be disposed between the gate electrode GE and the first and second transistor electrodes TE1 and TE2. Also, the interlayer insulating layer ILD may be disposed between the second power conductive layer PL2*b* and a third power conductive layer PL2*c*.

The interlayer insulating layer ILD may be a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The first and second transistor electrodes TE1 and TE2 of the transistor M and the third power conductive layer PL2*c* may be disposed on the interlayer insulating layer ILD. The first and second transistor electrodes TE1 and TE2 and the third power conductive layer PL2*c* may be disposed in a same layer. For example, the first and second transistor electrodes TE1 and TE2 and the third power conductive layer PL2*c* may be simultaneously formed through a same process, but the disclosure is not necessarily limited thereto.

The first and second transistor electrodes TE1 and TE2 may be disposed to overlap the semiconductor pattern SCP in the third direction DR3. The first and second transistor electrodes TE1 and TE2 may be electrically connected to the semiconductor pattern SCP. For example, the first transistor electrode TE1 may be electrically connected to the first region of the semiconductor pattern SCP through a contact hole penetrating the interlayer insulating layer ILD. Also, the first transistor electrode TE1 may be electrically connected to the lower auxiliary electrode layer BML through a contact hole penetrating the interlayer insulating layer ILD and the buffer layer BFL. The second transistor electrode TE2 may be electrically connected to the second region of the semiconductor pattern SCP through a contact hole penetrating the interlayer insulating layer ILD. In an embodiment, any one of the first and second transistor electrodes TE1 and TE2 may be a source electrode, and the other of the first and second transistor electrodes TE1 and TE2 may be a drain electrode. The second transistor electrode TE2 may be electrically connected to a first electrode ALE1 through a first contact part CNT1 penetrating a protective layer PSV and a via layer VIA.

The third power conductive layer PL2*c* may be disposed to overlap the first power conductive layer PL2*a* and/or the second power conductive layer PL2*b* in the third direction DR3. The third power conductive layer PL2*c* may be electrically connected to the first power conductive layer PL2*a* and/or the second power conductive layer PL2*b*. For example, the third power conductive layer PL2*c* may be electrically connected to the first power conductive layer PL2*a* through a contact hole penetrating the interlayer insulating layer ILD and the buffer layer BFL. Also, the third power conductive layer PL2*c* may be electrically connected to the second power conductive layer PL2*b* through a contact hole penetrating the interlayer insulating layer ILD. The third power conductive layer PL2*c* along with the first power conductive layer PL2*a* and/or the second power conductive layer PL2*b* may constitute the second power line PL2 described with reference to FIG. 4 and the like, within the spirit and the scope of the disclosure. The third power conductive layer PL2*c* may be electrically connected to a second electrode ALE2 through a second contact part CNT2 penetrating the protective layer PSV and the via layer VIA.

The first and second transistor electrodes TE1 and TE2 and the third power conductive layer PL2*c* may be formed as a single layer or a multi-layer, which is made of molybdenum (Mo), copper (Cu), aluminum (Al), chromium (Cr), gold (Au), titanium (Ti), nickel (Ni), neodymium (Nd), indium (In), tin (Sn), and any oxide or alloy thereof.

The protective layer PSV may be disposed on the first and second transistor electrodes TE1 and TE2 and the third power conductive layer PL2*c*. The protective layer PSV may be a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The via layer VIA may be disposed on the protective layer PSV. The via layer VIA may be made of an organic material to planarize a lower step difference. For example, the via layer VIA may include an organic material such as acrylic resin, epoxy resin, phenolic resin, polyamides resin, polyimides resin, polyester resin, poly-phenylene sulfide resin, or benzocyclobutene (BCB). However, the disclosure is not necessarily limited thereto, and the via layer VIA may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

Electrodes ALE may be disposed on the via layer VIA of the pixel circuit layer PCL. First to third electrodes ALE1, ALE2, and ALE3 may be disposed to be spaced apart from each other, and be disposed in a same layer. For example, the electrodes ALE may be simultaneously formed through a same process.

The electrodes ALE may be supplied with an alignment signal in a process of aligning light emitting elements LD. Accordingly, an electric filed is formed between the electrodes ALE, so that the light emitting elements LD can be aligned between the electrodes ALE.

In accordance with an embodiment, the electrodes ALE may be formed roughly flat. For example, the electrodes ALE may be formed on the via layer VIA in which any separate step difference is not formed. In case that a process of patterning the electrodes ALE is performed, the electrodes ALE can be uniformly patterned, and a process variation in the patterning process can be substantially decreased.

The electrodes ALE may include at least one conductive material. In an example, the electrodes ALE may include at least one metal or any alloy including the same among various metallic materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, at least one conductive oxide such as Indium Tin Oxide (ITO), Indium Zinc Oxide (IZO), Indium Tin Zinc Oxide (ITZO), Zinc Oxide (ZnO), Aluminum doped Zinc Oxide (AZO), Gallium doped Zinc Oxide (GZO), Zinc Tin Oxide (ZTO), Gallium Tin Oxide (GTO), and Fluorine doped Tin Oxide (FTO), and at least one conductive material among conductive polymers such as PEDOT, but the disclosure is not necessarily limited thereto.

In accordance with an embodiment, the first electrode ALE1 may be exposed by a first insulating layer INS1. The first electrode ALE1 may be electrically connected to a first connection electrode ELT1 (for example, a (1_1)th connection electrode ELT1_1 as a portion of the first connection electrode ELT1) through a contact hole CH disposed at a position corresponding to the exposed area. Although not shown in the drawings, the second electrode ALE2 may be exposed by the first insulating layer INS1. The second electrode ALE2 may be electrically connected to a second connection electrode ELT2 through one contact hole disposed at a position corresponding to the exposed area.

The first insulating layer INS1 may be disposed on the electrodes ALE. The first insulating layer INS1 may have a single-layer structure or a multi-layer structure. The first insulating layer INS1 may include an inorganic material. In an embodiment, the first insulating layer INS1 may include at least one selected from the group consisting of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In accordance with an embodiment, the first insulating layer INS1 may cover the electrodes ALE. The first insulating layer INS1 may cover a back surface of the bank BNK. In an embodiment, the first insulating layer INS1 may protect the electrodes ALE from influence during a manufacturing process of the display device. For example, the first insulating layer INS1 may cover the electrodes ALE. Accordingly, the first insulating layer INS1 can substantially prevent a developer for patterning an organic material for forming the bank BNK from damaging the electrodes ALE.

The bank BNK may be disposed on the first insulating layer INS1. The back surface of the bank BNK may be covered by the first insulating layer INS1. A side surface of the bank BNK may be covered by a second insulating layer INS2. In an embodiment, a surface of the bank BNK except an area corresponding to an opening 100 may be covered by the first insulating layer INS1 and/or the second insulating layer INS2.

In case that the ink INK for providing light emitting elements LD is supplied to each sub-pixel SPXL, the bank BNK may define an area to which the ink INK is supplied. For example, the bank BNK may be a dam structure defining a space in which the ink INK can be accommodated. In accordance with an embodiment, the space in which the ink INK can be accommodated may be substantially determined according to a position at which the opening 100 formed on the bank BNK is formed.

The bank BNK may form a step difference for readily disposing light emitting elements LD in one area or an area. For example, the bank BNK may be disposed adjacent to a position at which the light emitting elements LD are to be aligned, and have an inclined surface inclined at one angle at an adjacent position. In case that the ink INK including light emitting elements LD is supplied, the light emitting elements LD may have a tendency to be disposed in an area defined by the bank BNK, and consequently, an alignment degree of the light emitting elements LD can be substantially improved.

For example, in accordance with an embodiment, the bank BNK (for example, a first bank BNK1) may define an area to which the ink INK is supplied. At the same time, the bank BNK may form a step difference for readily disposing the light emitting elements LD. The step difference may be implemented as the opening 100 formed by the second insulating layer INS2 is disposed on one surface of the bank BNK. This will be described in detail later.

The bank BNK may include an organic material. For example, the bank BNK may include one selected from the group consisting of acrylic resin, epoxy resin, phenolic resin, polyamide resin, polyimide resin, polyester resin, poly-phenylene sulfide resin, and benzocyclobutene (BCB). However, the disclosure is not necessarily limited to the above-described example.

The second insulating layer INS2 may be disposed on the bank BNK. The second insulating layer INS2 may have a single-layer structure or a multi-layer structure. The second insulating layer INS2 may include an inorganic material. In an embodiment, the second insulating layer INS2 may include at least one selected from the group consisting of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). In an embodiment, the second insulating layers INS2 may include a same material or similar material as the first insulating layer INS1. In case that the first insulating layer INS1 and the second insulating layer INS2 are collectively etched, a process deviation of the etching process can be minimized.

The second insulating layer INS2 may cover at least a portion of the bank BNK. For example, the second insulating layer INS2 may be disposed on side and top surfaces of the bank BNK except an area corresponding to the opening 100. The second insulating layer INS2 may be disposed on the first bank BNK1 and a second bank BNK2. In an embodiment, one surface of the second insulating layer INS2 may contact with the bank BNK.

The second insulating layer INS2 may form the opening 100 by exposing a portion of the first bank BNK1. The second insulating layer INS2 may not expose the second bank BNK2. For example, in a plan view, the opening 100 may be formed on the (1_1)th bank BNK1_1 as the first bank BNK1 overlapping the first electrode ALE1. In a plan view, the opening 100 may be formed on a (1_2)th bank BNK1_2 as the first bank BNK1 overlapping the third electrode ALE3. The opening 100 may not be formed on the second bank BNK2.

As described above, in accordance with an embodiment, the bank BNK may include an organic material, and be covered by the second insulating layer INS2 including an inorganic material. At least a portion of the bank BNK may not be covered by the second insulating layer INS2. Accordingly, the at least a portion of the bank BNK may be exposed. Experimentally, in case that a plasma surface treatment process is performed, a surface-treated organic material may have a hydrophobic property as compared with a surface-treated inorganic material. For example, in case that the bank BNK may include an organic material, and the second insulating layer INS2 disposed on the bank BNK may include an inorganic material, the bank BNK exposed by the opening 100 may have a hydrophobic property as compared with the second insulating layer INS2, in case that a plasma surface treatment process is performed on the bank BNK and the second insulating layer INS2. For example, since the bank BNK has a hydrophobic property in an area corresponding to the opening 100, the ink INK may be disposed based on the area defined by the opening 100, in case that the ink INK for providing light emitting elements LD is supplied. For example, in conjunction with FIG. 6, the ink INK may be substantially disposed in an area surrounded by the opening 100 by using the area surrounded by the opening 100 as an edge area.

The bank BNK may form a step difference for allowing the light emitting element LD to be disposed at an appropriate position, which has been described above. The light emitting element LD may be disposed, by way of non-limiting example, superiorly at a position at which the light emitting element LD is to be aligned. Accordingly, it is necessary to provide the ink INK, based on an area in which the light emitting element LD is to be disposed. In accordance with an embodiment, since the second insulating layer INS2 including an inorganic material is disposed on the bank BNK forming the step difference, the second insulating layer INS2 may have a relatively hydrophilic property. The ink INK may have a tendency to be disposed in the second insulating layer INS2 to the first insulating layer INS1 in which the bank BNK is nod disposed, as compared with a position corresponding to the opening 100. Accordingly, the ink INK is superiorly provided in an area in which light emitting elements LD are arranged, and consequently, an alignment degree of the light emitting elements LD can be substantially improved. An amount of the ink INK consumed unnecessarily is decreased, and thus process cost can be saved.

In accordance with an embodiment, the second insulating layer INS2 may be disposed without allowing the first insulating layer INS1 to be disposed on the first bank BNK. The first insulating layer INS1 and the second insulating layer INS2 may be simultaneously disposed in at least a portion of the area in which the first bank BNK1 is not disposed. Accordingly, a thickness of a layer in which the first insulating layer INS1 and the second insulating layer INS2 are disposed together as the area in which the first bank BNK1 is not disposed may be greater than a thickness of the second insulating layer INS2 disposed on a top surface of the first bank BNK1.

The light emitting elements LD may be disposed on the first insulating layer INS1. The light emitting elements LD may be disposed in an area surrounded by the bank BNK. The light emitting elements LD may be disposed between the electrodes ALE on the first insulating layer INS1.

A third insulating layer INS3 may be disposed on the light emitting elements LD. For example, the third insulating layer INS3 may be partially provided on the light emitting elements LD, and expose first and second end portions EP1 and EP2 of the light emitting elements LD. In case that the third insulating layer INS3 is formed on the light emitting elements LD after the alignment of the light emitting elements LD is completed, the light emitting elements LD can be prevented from being separated from a position at which the light emitting elements LD are aligned.

The third insulating layer INS3 may be a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The connection electrodes ELT may be disposed on both the end portions of the light emitting elements LD, which are exposed by the third insulating layer INS3. For example, the (1_1)th connection electrode ELT1_1 and the (1_2)th connection electrode ELT1_2 may be disposed on one end portion of the light emitting element LD, the second insulating layer INS2, and the first bank BNK1 in the opening 100. The second connection electrode ELT2 may be disposed on the other end of the light emitting element LD and the second insulating layer INS2.

In accordance with an embodiment, the connection electrodes ELT may be disposed in a same layer. For example, the connection electrodes ELT may be configured of the same conductive layer. The connection electrodes ELT may be simultaneously formed through a same process. However, the disclosure is not limited to the above-described example. For example, the connection electrodes ELT may be formed through different processes. For example, after the first connection electrode ELT1 is patterned, the second connection electrode ELT2 may be patterned.

The connection electrodes ELT may be formed with various transparent conductive materials. In an example, the connection electrodes ELT may include at least one of various transparent conductive materials including Indium Tin Oxide (ITO), Indium Zinc Oxide (IZO), Indium Tin Zinc Oxide (ITZO), Aluminum doped Zinc Oxide (AZO), Gallium doped Zinc Oxide (GZO), Zinc Tin Oxide (ZTO), and Gallium Tin Oxide (GTO), and be implemented substantially transparently or translucently to satisfy a transmittance. Accordingly, light emitted from the light emitting elements LD can be emitted to the outside of the display panel PNL while passing through the connection electrodes ELT.

A fourth insulating layer INS4 may be disposed on the first insulating layer INS1, the second insulating layer INS2, the connection electrodes ELT, and the third insulating layer INS3, to protect components of the light emitting element layer LEL. In an embodiment, the fourth insulating layer INS4 may be a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The stacked structure of the sub-pixel SPXL is not limited to the above-described example. The sub-pixel SPXL may further include an additional insulating layer or an additional electrode layer, and have various structures.

A detailed structure of the first bank BNK1 and the opening 100 in accordance with an embodiment will be described with reference to FIG. 9.

Referring to FIG. 9, a cavity CAV may be formed at the top surface of the first bank BNK1. For example, in a plan view, at least a portion of an upper surface of the first bank BNK1 may be recessed in an area overlapping the opening 100. In an embodiment, a U-shaped recessed structure may be formed on one surface of the first bank BNK1. The (1_1)th connection electrode ELT1_1 may be disposed on the one surface of the first bank BNK1 through the opening 100 and the cavity CAV. In an embodiment, the (1_1)th connection electrode ELT1_1 may contact with the top surface of the first bank BNK1, which is exposed through the opening 100 and the cavity CAV.

A position of the cavity CAV may correspond to the position of the opening 100. For example, in an embodiment, the opening 100 may be formed by etching the second insulating layer INS2. The second insulating layer INS2 and the cavity CAV may not overlap each other in a plan view. At least a portion of the first bank BNK1 including an organic material may be removed in the process of etching the second insulating layer INS2.

As described above, the first bank BNK1 is exposed in the opening 100, to have a hydrophobic property according to a process phase. Accordingly, a boundary line at which the ink INK is proved may be defined. Particularly, in accordance with an embodiment, the U-shape recessed structure is formed on the one surface of the first bank BNK1, so that a wider surface of the first bank BNK1 can be exposed. Accordingly, the boundary line at which the ink INK is provided can be more clearly defined.

Continuously, layers which may be disposed on the light emitting element layer LEL in accordance with an embodiment will be described with reference to FIG. 10. FIG. 10 illustrates a color conversion layer CCL, an optical layer OPL, and/or a color filter layer CFL. In FIG. 10, for convenience of description, a portion of a detailed configuration of the pixel circuit layer PCL and the light emitting element layer LEL will be omitted.

Referring to FIG. 10, a separation bank CBNK may be disposed between first to third sub-pixels SPXL1, SPXL2, and SPXL3 or at a boundary of the first to third sub-pixels SPXL1, SPXL2, and SPXL3, and form an opening overlapping each of the first to third sub-pixels SPXL1, SPXL2, and SPXL3. The opening formed by the separation bank CBNK may provide a space in which the color conversion layer CCL can be provided. For example, a desired kind and/or a desired amount of color conversion layer CCL may be supplied to the space partitioned by the opening formed by the separation bank CBNK.

The separation bank CBNK may include an organic material such as acrylic resin, epoxy resin, phenolic resin, polyamide resin, polyimide resin, unsaturated polyester resin, poly-phenylene ether resin, poly-phenylene sulfide resin, or benzocyclobutene (BCB). However, the disclosure is not necessarily limited thereto, and the separation bank CBNK may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In an embodiment, the separation bank CBNK may include at least one light blocking material and/or at least one reflective material. Accordingly, light leakage between adjacent pixels PXL can be prevented. For example, the separation bank CBNK may include a black pigment, but the disclosure is not necessarily limited thereto.

The color conversion layer CCL may be disposed above light emitting elements LD in the opening formed by the separation bank CBNK. The color conversion layer CCL may include a first color conversion layer CCL1 disposed in the first sub-pixel SPXL1, a second color conversion layer CCL2 disposed in the second sub-pixel SPXL2, and a light scattering layer LSL disposed in the third sub-pixel SPXL3.

In an embodiment, the first to third sub-pixels SPXL1, SPXL2, and SPXL3 may include light emitting elements LD emitting light of a same color. For example, the first to third sub-pixels SPXL1, SPXL2, and SPXL3 may include light emitting elements LD emitting light of a third color (or blue). The color conversion layer CCL including color conversion particles is disposed on each of the first to third sub-pixels SPXL1, SPXL2, and SPXL3, so that a full-color image can be displayed.

The first color conversion layer CCL1 may include first color conversion particles for converting light of the third color, which is emitted from the light emitting element LD, into light of a first color. For example, the first color conversion layer CCL1 may include first quantum dots QD1 dispersed in a matrix material such as base resin.

In an embodiment, in case that the light emitting element LD is a blue light emitting element emitting light of blue, and the first sub-pixel SPXL1 is a red pixel, the first color conversion layer CCL1 may include a first quantum dot QD1 for converting light of blue, which is emitted from the blue light emitting element, into light of red. The first quantum dot QD1 may absorb blue light and emit red light by shifting a wavelength of the blue light according to energy transition. In case that the first sub-pixel SPXL1 is a pixel of another color, the first color conversion layer CCL1 may include a first quantum dot QD1 corresponding to the color of the first sub-pixel SPXL1.

The second color conversion layer CCL2 may include second color conversion particles for converting light of the third color, which is emitted from the light emitting element LD, into light of a second color. For example, the second color conversion layer CCL2 may include second quantum dots QD2 dispersed in a matrix material such as base resin.

In an embodiment, in case that the light emitting element LD is a blue light emitting element emitting light of blue, and the second sub-pixel SPXL2 is a green pixel, the second color conversion layer CCL2 may include a second quantum dot QD2 for converting light of blue, which is emitted from the blue light emitting element, into light of green. The second quantum dot QD2 may absorb blue light and emit green light by shifting a wavelength of the blue light according to energy transition. In case that the second sub-pixel SPXL2 is a pixel of another color, the second color conversion layer CCL2 may include a second quantum dot QD2 corresponding to the color of the second sub-pixel SPXL2.

In an embodiment, light of blue having a relatively short wavelength in a visible light band is incident into the first quantum dot QD1 and the second quantum dot QD2, so that absorption coefficients of the first quantum dot QD1 and the second quantum dot QD2 can be increased. Accordingly, the efficiency of light finally emitted from the first sub-pixel SPXL1 and the second sub-pixel SPXL2 can be improved, and excellent color reproduction can be ensured. The light emitting unit EMU of each of the first to third sub-pixels SPXL1, SPXL2, and SPXL3 may be formed by using light emitting elements of a same color (for example, blue light emitting elements), so that the manufacturing efficiency of the display device can be improved.

The light scattering layer LSL may be provided to efficiently use light of the third color (or blue) emitted from the light emitting element LD. In an example, in case that the light emitting element LD is a blue light emitting element emitting light of blue, and the third sub-pixel SPXL3 is a blue pixel, the light scattering layer LSL may include at least one kind of light scattering particle SCT to efficiently use light emitted from the light emitting element LD. In an example, the light scattering particle SCT of the light scattering layer LSL may include at least one of barium sulfate ($BaSO_4$), calcium carbonate ($CaCO_3$), titanium oxide ($TiO_2$), silicon oxide ($SiO_2$), aluminum oxide ($Al_2O_3$), zirconium oxide ($ZrO_2$), and zinc oxide (ZnO). The light scattering particle SCT is not disposed only in the third sub-pixel SPXL3, and may be selectively included in the first color conversion layer CCL2 or the second color conversion layer CCL2. In an embodiment, the light scattering particle SCT may be omitted such that the light scattering layer LSL of transparent polymer is provided.

A first capping layer CPL1 may be disposed on the color conversion layer CCL. The first capping layer CPL1 may be provided through the first to third sub-pixels SPXL1, SPXL2, and SPXL3. The first capping layer CPL1 may cover the color conversion layer CCL. The first capping layer CPL1 may prevent the color conversion layer CCL from being damaged or contaminated due to infiltration of an impurity such as moisture or air from the outside.

The first capping layer CPL1 is an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), and the like, within the spirit and the scope of the disclosure.

The optical layer OPL may be disposed on the first capping layer CPL1. The optical layer OPL may function to improve light extraction efficiency by recycling light provided from the color conversion layer CCL through total reflection. To this end, the optical layer OPL may have a refractive index relatively lower than a refractive index of the color conversion layer CCL. For example, the refractive index of the color conversion layer may be about 1.6 to about 2.0, and the refractive index of the optical layer OPL may be about 1.1 to about 1.3.

A second capping layer CPL2 may be disposed on the optical layer OPL. The second capping layer CPL2 may be provided throughout the first to third sub-pixels SPXL1, SPXL2, and SPXL3. The second capping layer CPL2 may cover the optical layer OPL. The second capping layer CPL2 may prevent the optical layer OPL from being damaged or contaminated due to infiltration of an impurity such as moisture or air from the outside.

The second capping layer CPL2 is an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), and the like, within the spirit and the scope of the disclosure.

A planarization layer PLL may be disposed on the second capping layer CPL2. The planarization layer PLL may be provided throughout the first to third sub-pixels SPXL1, SPXL2, and SPXL3.

The planarization layer PLL may include an organic material such as acrylic resin, epoxy resin, phenolic resin, polyamide resin, polyimide resin, unsaturated polyester resin, poly-phenylene ether resin, poly-phenylene sulfide resin, or benzocyclobutene (BCB). However, the disclosure is not necessarily limited thereto, and the planarization layer PLL may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The color filter layer CFL may be disposed on the planarization layer PLL. The color filter layer CFL may include color filters CF1, CF2, and CF3 which accord with a color of each pixel PXL. The color filters CF1, CF2, and CF3 which accord with a color of each of the first to third sub-pixels SPXL1, SPXL2, and SPXL3 are disposed, so that a full-color image can be displayed.

The color filter layer CFL may include a first color filter CF1 disposed in the first sub-pixel SPXL1 to allow light emitted from the first sub-pixel SPXL1 to be selectively transmitted therethrough, a second color filter CF2 disposed in the second sub-pixel SPXL2 to allow light emitted from the second sub-pixel SPXL2 to be selectively transmitted therethrough, and a third color filter CF3 disposed in the third sub-pixel SPXL3 to allow light emitted from the third sub-pixel SPXL3 to be selectively transmitted therethrough.

In an embodiment, the first color filter CF1, the second color filter CF2, and the third color filter CF3 may be respectively a red color filter, a green color filter, and a blue color filter, but the disclosure is not necessarily limited thereto. Hereinafter, in case that an arbitrary color filter among the first color filter CF1, the second color filter CF2, and the third color filter CF3 is designated or in case that two or more kinds of color filters are inclusively designated, the corresponding color filter or the corresponding color filters are referred to as a "color filter CF" or "color filters CF."

The first color filter CF1 may overlap the first color conversion layer CCL1 of the first sub-pixel SPXL1 in the third direction DR3. The first color filter CF1 may include a color filter material for allowing light of a first color (or red) to be selectively transmitted therethrough. For example, in case that the first sub-pixel SPXL1 is a red pixel, the first color filter CF1 may include a red color filter material.

The second color filter CF2 may overlap the second color conversion layer CCL2 of the second sub-pixel SPXL2 in the third direction DR3. The second color filter CF2 may include a color filter material for allowing light of a second color (or green) to be selectively transmitted therethrough. For example, in case that the second sub-pixel SPXL2 is a green pixel, the second color filter CF2 may include a green color filter material.

The third color filter CF3 may overlap the light scattering layer LSL of the third sub-pixel SPXL3 in the third direction DR3. The third color filter CF3 may include a color filter material for allowing light of a third color (or blue) to be selectively transmitted therethrough. For example, in case that the third sub-pixel SPXL3 is a blue pixel, the third color filter CF3 may include a blue color filter material.

In an embodiment, a light blocking layer BM may be further disposed between the first to third color filters CF1, CF2, and CF3. As described above, in case that the light blocking layer BM is formed between the first to third color filters CF1, CF2, and CF3, a color mixture defect viewed at the front or side of the display device can be prevented. The material of the light blocking layer BM is not particularly limited, and the light blocking layer BM may be formed with various light blocking materials. In an example, the light blocking layer BM may be implemented by stacking the first to third color filters CF1, CF2, and CF3.

An overcoat layer OC may be disposed on the color filter layer CFL. The overcoat layer OC may be provided throughout the first to third sub-pixels SPXL1, SPXL2, and SPXL3. The overcoat layer OC may cover a lower member including the color filter layer CFL. The overcoat layer OC may prevent moisture or air from infiltrating into the above-described lower member. Also, the overcoat layer OC may protect the above-described lower member from a foreign matter such as dust.

The overcoat layer OC may include an organic material such as acrylic resin, epoxy resin, phenolic resin, polyamide resin, polyimide resin, unsaturated polyester resin, poly-phenylene ether resin, poly-phenylene sulfide resin, or benzocyclobutene (BCB). However, the disclosure is not necessarily limited thereto, and the overcoat layer OC may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A sectional structure of a pixel PXL (or sub-pixel SPXL) in accordance with an embodiment will be described with reference to FIG. 11. FIG. 11 is a view illustrating a sub-pixel in accordance with an embodiment, and is a schematic sectional view taken along the line A-A' shown in FIG. 5. In FIG. 11, descriptions of portions overlapping those described above will be simplified or will not be repeated.

Figure 11:
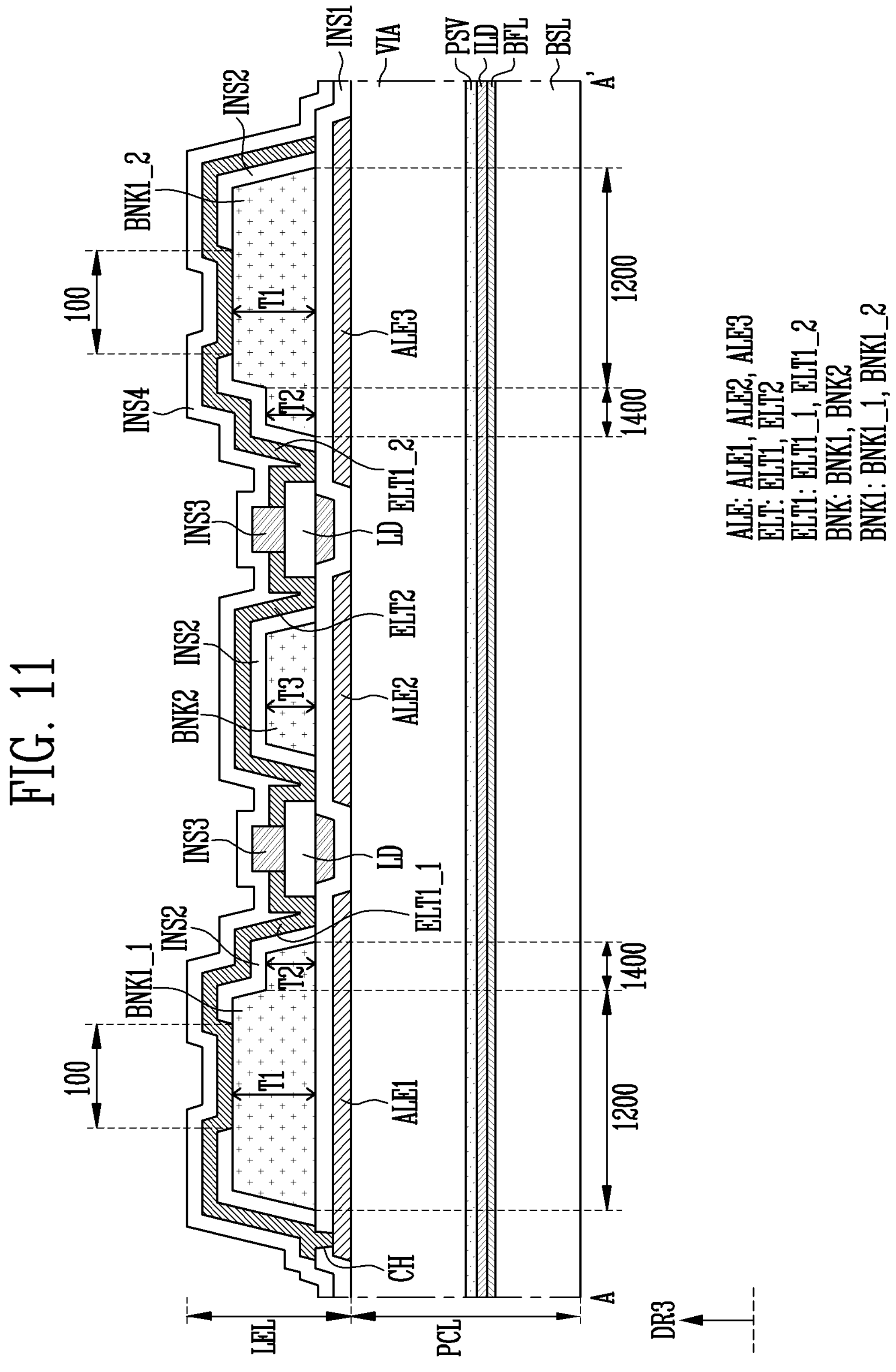
FIG. 11 is a view illustrating a sub-pixel in accordance with an embodiment, and is a schematic sectional view taken along the line A-A' shown in FIG. 5.

Referring to FIG. 11, the sub-pixel SPXL in accordance with an embodiment may be different from the sub-pixel SPXL in accordance with an embodiment, in that the first bank BNK1 may include two or more areas having different thicknesses.

In accordance with an embodiment, the first bank BNK1 may include a first bank area 1200 for forming a dam structure in which the ink INK may be accommodated and a second bank area 1400 capable of forming a step different for allowing light emitting elements LD to be readily disposed. For example, the first bank BNK1 may be a wall structure for readily disposing the light emitting elements LD and simultaneously be a dam structure for being supplied with the ink INK.

The first bank BNK1 may include the first bank area 1200 having a first thickness T1 and the second bank area 1400 having a second thickness T2. For example, the first bank BNK1 may include the first bank area 1200 having a relatively thick thickness and the second bank area 1400 having a relatively thin thickness. Accordingly, the first bank BNK1 can have a structure having a step difference. The second bank area 1400 may form a step difference smaller than a step difference of the first bank area 1200. The second bank area 1400 may be more adjacent to the light emitting element LD than the first bank area 1200.

In accordance with an embodiment, the first bank area 1200 may correspond to the area in which the opening 100 is formed. For example, the first bank area 1200 may overlap the opening 100 in a plan view. The first bank area 1200 may include an area in which one surface of the first bank BNK1 is exposed. The second bank area 1400 may correspond to an area in which the opening 100 is not formed. For example, the second bank area 1400 may not overlap the opening 100 in a plan view. The second bank BNK2 may have a thickness corresponding to the second bank area 1400 of the first bank BNK1. For example, a first thickness T1 may be thicker than the second thickness T2. In an embodiment, the second thickness T2 and the third thickness T3 may correspond to each other.

In accordance with an embodiment, the second bank BNK2 and the second bank area 1400 of the first bank BNK1 may form a corresponding step difference. Accordingly, the light emitting element LD can be readily disposed between the second bank BNK2 and the second bank area 1400 of the first bank BNK1.

For example, the second bank area 1400 of the first bank BNK1 and the second bank BNK2 may form a step difference for allowing the light emitting element LD to be readily disposed. For example, one side or a side of the second bank BNK2 and the second bank area 1400 of the (1_1)th bank BNK1_1 may form a wall structure for disposing a light emitting element LD disposed on the first electrode ALE1 and the second electrode ALE2. The other side of the second bank BNK2 and the second bank area 1200 of the (1_2)th bank BNK1_2 may form a wall structure for disposing a light emitting element LD disposed on the second electrode ALE2 and the third electrode ALE3.

In accordance with an embodiment, the thickness of the second bank area 1400 and the second bank BNK2, which form a step difference such that the light emitting element LD is readily disposed, is minimized, so that, in case that the ink INK for providing the light emitting elements LD is supplied onto the base layer BSL, the amount of the ink INK provided in an area in which the ink INK is to be supplied can be increased.

A manufacturing method for the display device in accordance with an embodiment will be described with reference to FIGS. 12 to 21. In FIGS. 12 to 21, descriptions of portions overlapping those described above will be simplified or will not be repeated.

FIGS. 12 to 21 are process sectional views schematically illustrating a manufacturing method for the display device in accordance with an embodiment. FIGS. 12 to 21 may illustrate the sectional structure described above with reference to FIG. 7.

First, the manufacturing method for the display device in accordance with the embodiment will be described with reference to FIGS. 12 to 19.

Figure 12:
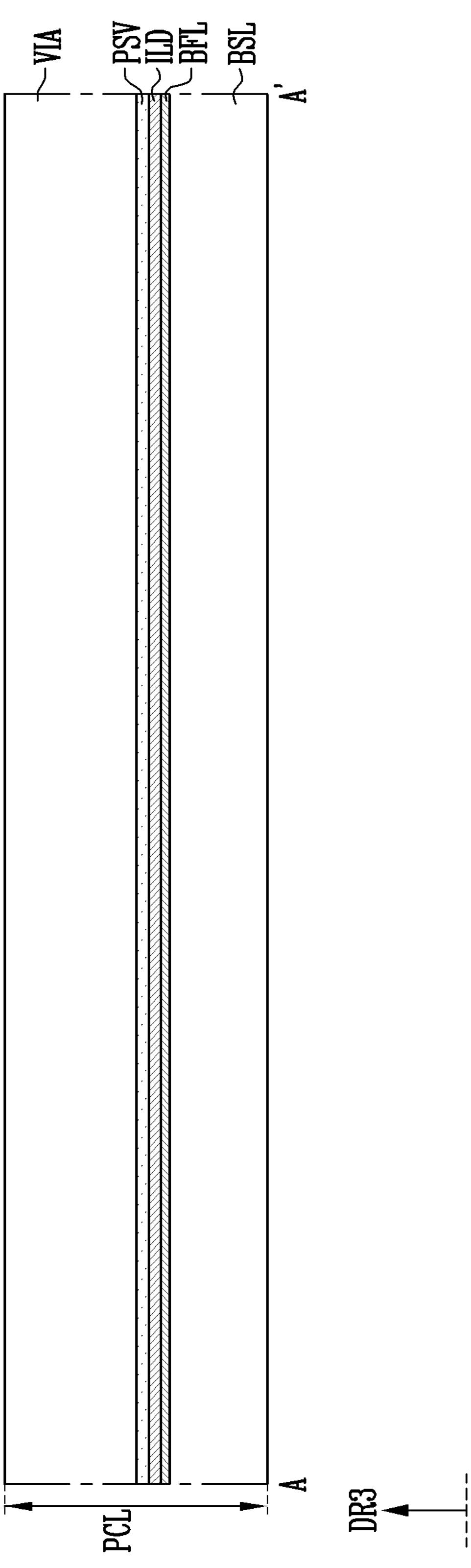

Referring to FIG. 12, a pixel circuit layer PCL may be formed by disposing a buffer layer BFL, an interlayer insulating layer ILD, a protective layer PSV, and a via layer VIA on a base layer BSL. Although not shown in the drawing, electrodes (or lines) disposed in the pixel circuit layer PCL may be disposed between the insulating layers.

By way of example, individual components (for example, the electrodes, the lines, the buffer layer BFL, the interlayer insulating layer ILD, the protective layer PSV, and the via layer VIA) of the pixel circuit layer PCL may be formed by patterning a conductive layer (or metal layer), an inorganic material, an organic material, or the like using a mask.

Figure 13:
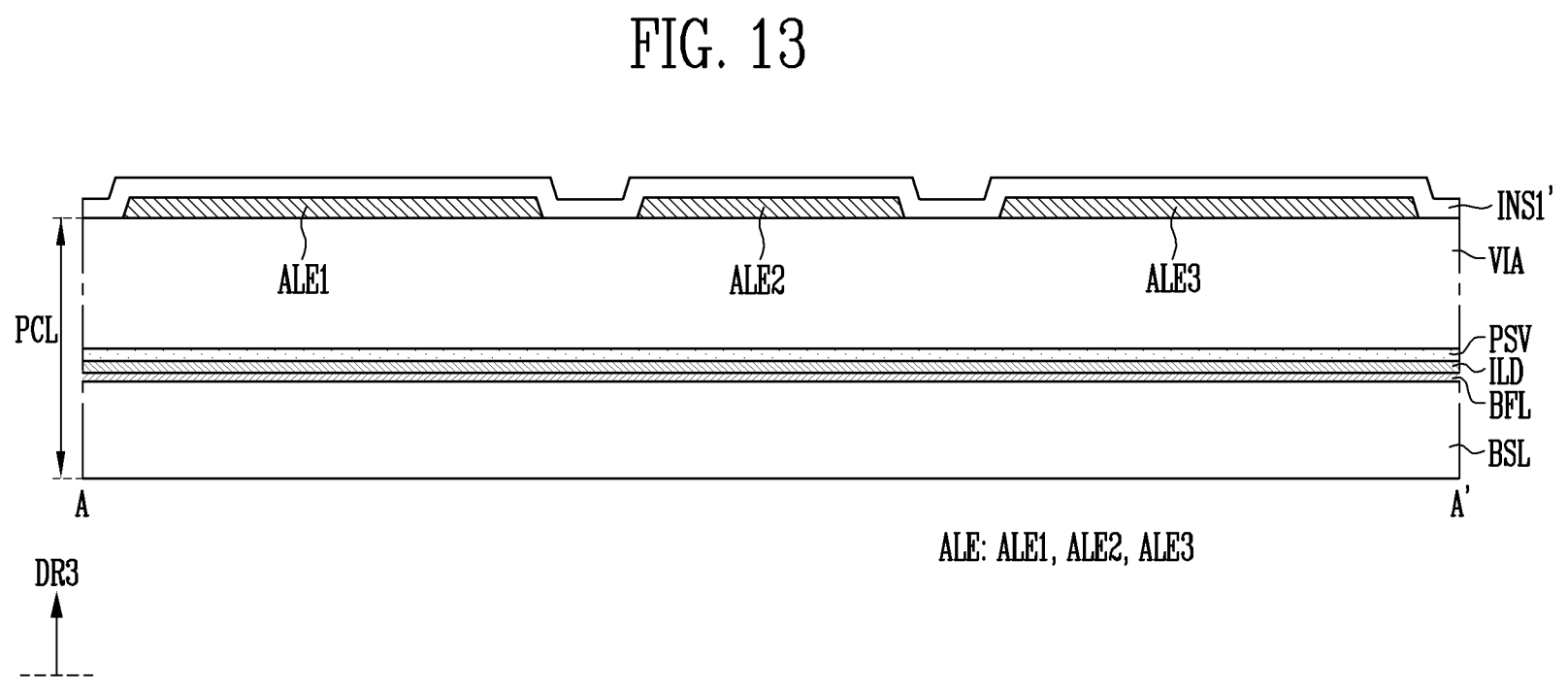

Referring to FIG. 13, electrodes ALE may be disposed on the pixel circuit layer PCL. A first base insulating layer INS1' may be disposed on the electrodes ALE.

By way of example, first to third electrodes ALE1 to ALE3 may be patterned on the via layer VIA. For example, a base electrode layer may be deposited. The base electrode layer may be etched such that the first to third electrodes ALE1 to ALE3 are spaced apart from each other.

The first base insulating layer INS1' is a component for forming a first insulating layer INS1. In case that the first base insulating layer INS1' is etched as a subsequent process is performed, the first insulating layer INS1 may be provided.

In accordance with an embodiment, the first to third electrodes ALE1 to ALE3 may be patterned to be spaced apart from each other, so that an area in which light emitting elements LD can be aligned is defined.

Referring to FIG. 14, a bank BNK may be formed on the first base insulating layer INS1'. For example, in a plan view, a (1_1)th bank BNK1_1 overlapping the first electrode ALE1, a second bank BNK2 overlapping the second electrode ALE2, and a (1_2)th bank BNK1_2 overlapping the third electrode ALE3 may be patterned on the first base insulating layer INS1'.

For example, a base bank layer (not shown) may be formed (or deposited) on the first base insulating layer INS1', and a photoresist layer may be formed on the base bank layer. A photoresist process may be performed by using a binary mask 2200 including a full-tone area FA. Accordingly, at least a portion of the photoresist layer may be removed (for example, patterned), and the photoresist layer may be provided (or prepared) as an etching mask including a full-tone part corresponding to the full-tone area FA. Subsequently, the base bank layer may be etched (for example, dry-etched) by using the etching mask, and accordingly, a bank BNK in accordance with an embodiment can be manufactured.

Figure 15:
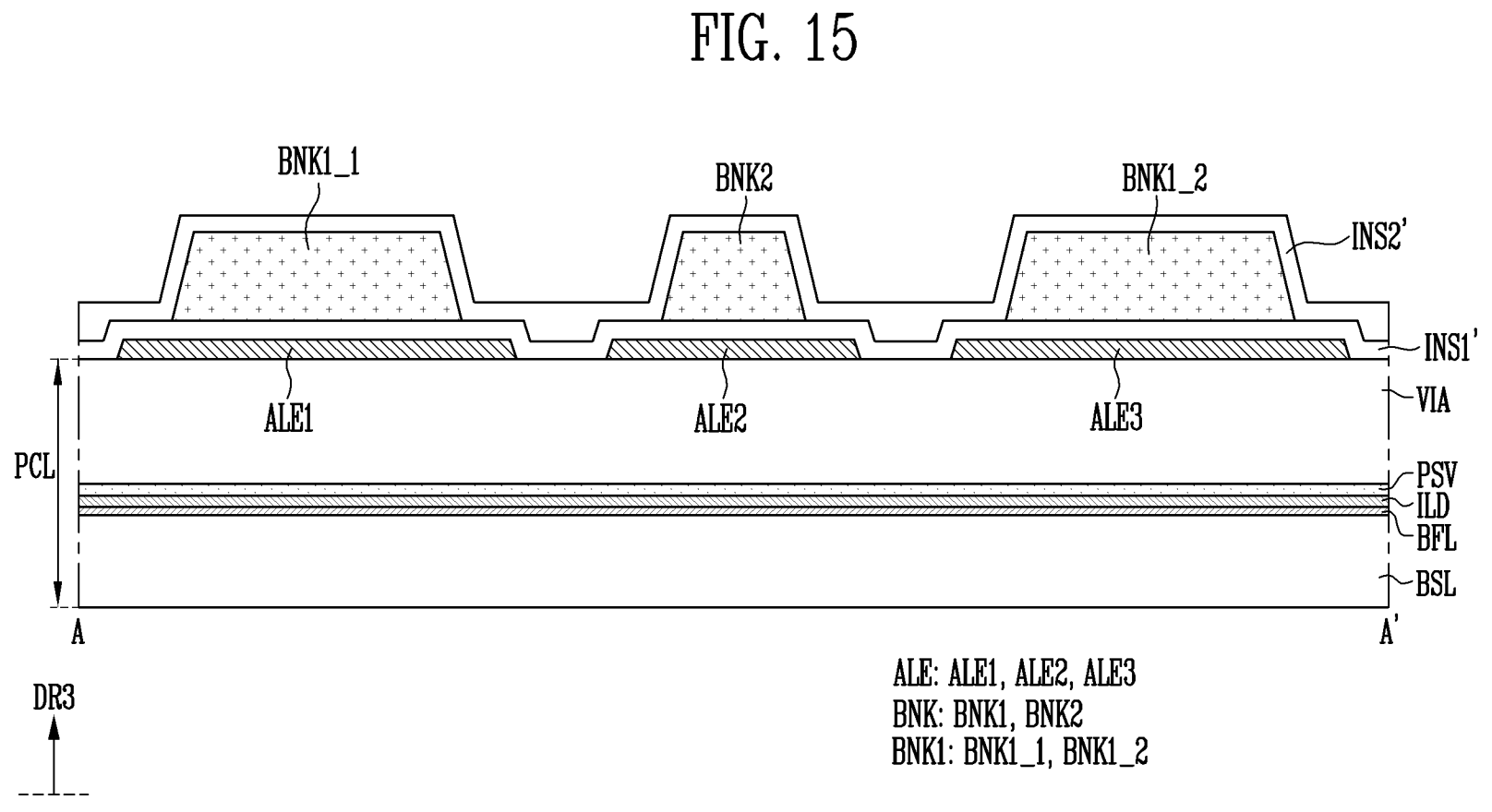

Referring to FIG. 15, a second base insulating layer INS2' may be disposed on the bank BNK and the first base insulating layer INS1'.

The second base insulating layer INS2' is a component for forming a second insulating layer INS2. In case that the second base insulating layer INS2' is etched as a subsequent process is performed, the second insulating layer INS2 may be provided.

By way of example, the second base insulating layer INS2' may be patterned such that at least a portion of the second base insulating layer INS2' covers one surface of the bank BNK. For example, the second base insulating layer INS2' may be formed on the one surface of the bank BNK, which faces a path area in which light emitting elements LD are to be disposed.

In an embodiment, the first base insulating layer INS1' and the second base insulating layer INS2' may include a same material or similar material. By way of example, the entire surface of the bank BNK may be covered by the first base insulating layer INS1' and the second base insulating layer INS2'. Accordingly, by way of example, an outer surface of the bank BNK may be covered by insulating layers including a same material or similar material.

Referring to FIG. 16, at least a portion of each of the first base insulating layer INS1' and the second base insulating layer INS2' may be removed. For example, the at least a portion of each of the first base insulating layer INS1' and the second base insulating layer INS2' may be etched. The etching may be wet etching or dry etching, but the disclosure is not limited to a specific example.

By way of example, the second base insulating layer INS2' may be etched, and accordingly, the second insulating layer INS2 may be provided. For example, a portion of the second base insulating layer INS2' may be removed, which corresponds to a position at which an opening 100 as one area or an area of the second base insulating layer INS2' is to be formed. In an embodiment, the second insulating layer INS2 may be patterned to be at least disposed on the outer surface of the bank BNK. For example, at least a portion of the second insulating layer INS2 may remain on a side surface of the bank BNK, on which a light emitting element LD is disposed.

By way of example, at least a portion of the bank BNK may be exposed. For example, one surface overlapping the opening 100 in a plan view, as one surface of the bank BNK, may be exposed. Accordingly, at least a portion of the bank BNK may be covered by the second insulating layer INS2, and at least another portion of the bank BNK is not covered by the second insulating layer INS2 but may be exposed.

By way of example, the second base insulating layer INS2' disposed on the second bank BNK2 may not be removed, and accordingly, an outer surface of the second bank BNK2 may not be exposed. Thus, the supply range of an ink INK can be specified based on an opening 100 corresponding to the (1_1)th bank BNK1_1 and an opening 100 corresponding to the (1_2)th bank BNK1_2.

By way of example, the first base insulating layer INS1' may be etched, and accordingly, the first insulating layer INS1 may be provided. For example, a portion of the first base insulating layer INS1' may be removed, which corresponds to a position at which a contact hole CH' is to be formed, as one area or an area of the first base insulating layer INS1'. Accordingly, at least a portion of the first electrode ALE1 may be exposed through the contact hole CH'. Although not shown in the drawing, one contact hole may be formed at another portion of the first base insulating layer INS1', so that the second electrode ALE2 is exposed.

By way of example, as described above, a cavity CAV may be formed while being adjacent to one surface of the first bank BNK1. For example, in a process of etching the second base insulating layer INS2' on the one surface of the first bank BNK1 so as to form the opening 100, at least a portion of the first bank BNK1 including an organic material may be removed. In an embodiment, the cavity CAV may have a U-shaped recessed structure.

In accordance with an embodiment, the first base insulating layer INS1' and the second base insulating layer INS2' may be etched through a single process. For example, at least a portion of each the first base insulating layer INS1' and the second base insulating layer INS2' may be removed in an etching process using the same mask. In an embodiment, a process for forming the contact hole CH' and a process for forming the opening 100 may be simultaneously performed.

As described above, in accordance with an embodiment, the first base insulating layer INS1' and the second base insulating layer INS2' may include a same material or similar material, and accordingly, a process deviation in case that an etching process is performed on layers can be minimized.

Figure 17:
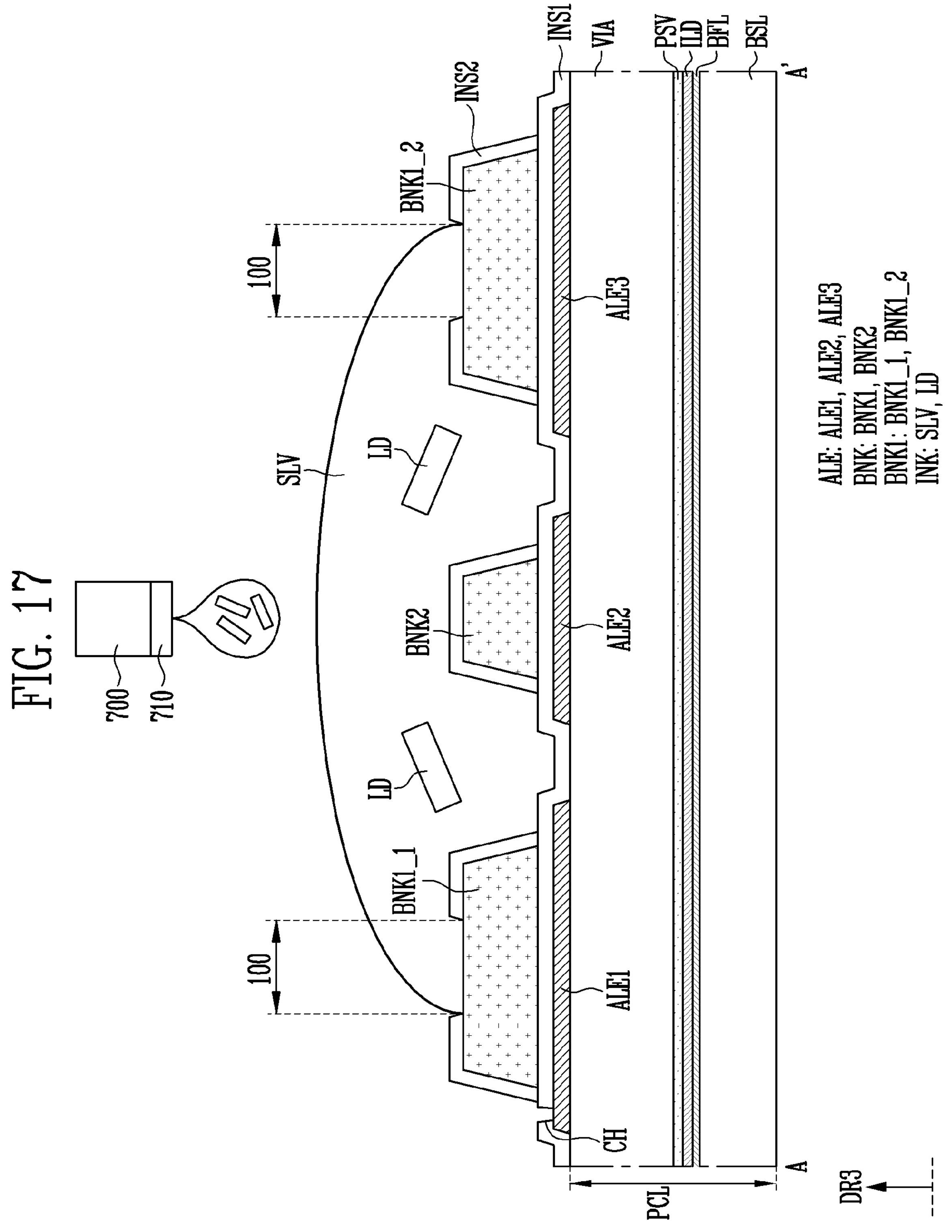

Referring to FIG. 17, a surface treatment process may be performed on the bank BNK and the second insulating layer INS2, and the ink INK may be supplied (or sprayed) onto the base layer BSL (or the first insulating layer INS1). The ink INK may be provided by a printing apparatus 700 that sprays a fluid.

In accordance with an embodiment, the printing apparatus 700 may include a nozzle device 710 that discharges a liquid fluid to the outside. The ink INK defined in this specification may mean a liquid mixture capable of being discharged by the printing apparatus 700. The printing apparatus 700 may spray the ink INK while moving above an area in which light emitting elements LD are to be arranged.

In accordance with an embodiment, the ink INK may include a solvent SLV and a light emitting element LD. The light emitting element LD may be provided in plurality, to be dispersed and provided in the solvent SLV having fluidity. For example, in an embodiment, the solvent SLV may have fluidity, and accordingly, the light emitting elements LD may be dispersed in the solvent SLV. The solvent SLV may mean a liquid-phase material, instead of a solid-phase material, in which the light emitting elements LD are dispersed and provided. In an embodiment, the solvent SLV may include an organic solvent. For example, the solvent SLV may be one of Propylene Glycol Methyl Ether Acetate (PGMEA), Dipropylene Glycol n-Propyl Ether (DGPE), and triethylene Glycol n-Butyl Ether (TGBE). However, the disclosure is not limited to the above-described example, and the solvent SLV may include various organic solvents.

By way of example, the ink INK may be accommodated in a space defined by the bank BNK. The light emitting elements LD included in the ink INK may be provided in a state in which the light emitting elements LD are randomly located in the space.

In accordance with an embodiment, the surface treatment process performed on the bank BNK and the second insulating layer INS2 may be a plasma surface treatment process. Various manners may be applied to the plasma surface treatment process. For example, may include a radio frequency (RF) power source, a medium frequency (MF) power source, a direct current (DC) power source, a microwave (MW) power source, or the like may be used as a power source for plasma surface treatment. However, the disclosure is not necessarily limited to a specific example. In an embodiment, in case that the surface treatment process is performed, surface energy of the bank BNK including an organic material may be changed, to have a hydrophobic property, and surface energy of the second insulating layer INS2 including an inorganic material may not be relatively changed. Accordingly, the one surface of the bank BNK, which is exposed by the opening 100, may have a hydrophobic property, and the outer surface of the second insulating layer INS2 may have a hydrophilic property. Accordingly, an area having a hydrophobic property may be formed at a position corresponding to the opening 100.

By way of example, in conjunction with an area in which the ink INK is supplied and a position of the opening 100, an edge of the area in which the ink INK is supplied may correspond to the position of the opening 100. In an embodiment, the ink INK may have a hydrophilic property. Accordingly, the ink INK has a tendency to be adjacent to the second insulating layer INS2 having a relatively hydrophilic property, and has a tendency not to be disposed in the opening having a relatively hydrophobic property (see FIG. 17). The second insulating layer INS2 having a relatively hydrophilic property may be disposed on the side surface of the bank BNK, which faces the light emitting element LD. Accordingly, the ink INK including the light emitting element LD can be superiorly supplied to an area in which the light emitting element LD. Consequently, the light emitting element LD can be prevented from being disposed in an unnecessary area, and the alignment degree of light emitting elements LD can be improved.

In the area in which the ink INK is supplied, the bank BNK may form a step difference. Accordingly, the light emitting elements LD can be located more adjacent to the area in which the light emitting element LD is disposed. In accordance with an embodiment, the bank BNK may be a structure defining a space in which the ink INK is accommodated and simultaneously, be a structure forming a step difference for facilitating arrangement of the light emitting elements. Experimentally, in case that the structure defining the space and the structure forming the step difference are manufactured as separate components, the light emitting element LD may be disposed adjacent to even an area between the structure defining the space and the structure forming the step difference. Some or a number of the light emitting elements LD are abnormally disposed, and therefore, the alignment degree of light emitting elements LD may be damaged. However, as described above, in accordance with an embodiment, the structure defining the space and the structure forming the step difference are provided as a single structure, so that a risk that the light emitting element LD will be abnormally disposed can be substantially prevented.

Referring to FIG. 18, the light emitting elements LD may be aligned on the electrodes ALE. The light emitting elements LD may be disposed on the first insulating layer INS1 between the banks BNK.

By way of example, the electrodes ALE may form an electric field. An electrical signal (for example, an alignment signal) may be provided to the electrodes ALE, so that an electric field is formed in an area in which the light emitting elements LD are to be aligned. For example, a first alignment signal may be provided to the first electrode ALE1, a second alignment signal may be provided to the second electrode ALE2, and an electric field based on the first alignment signal and the second alignment signal may be formed in an area in which light emitting elements LD are to be aligned between the (1_1)th bank BNK1_1 and the second bank BNK2. A first alignment signal may be provided to the third electrode ALE3, a second alignment signal may be provided to the second electrode ALE2, and an electric filed based on the first alignment signal and the second alignment signal may be formed in an area in which light emitting elements LD are to be aligned between the (1_2)th bank BNK1_2 and the second bank BNK2.

In accordance with an embodiment, the light emitting element LD may be moved (or rotated) by a force (for example, a dielectrophoresis (DEP) force) according to the electric field, to be aligned (or disposed) on the first insulating layer INS1. For example, the moved light emitting elements LD may be aligned on the electrodes ALE.

In accordance with an embodiment, the electrical signal (for example, the alignment signal) provided to the electrodes ALE may include an AC signal. For example, the first alignment signal may be an AC signal, and the second alignment signal may be a ground signal. As an example, the first alignment signal may be a ground signal, and the second alignment signal may be an AC signal. However, the disclosure is not necessarily limited to the above-described example. The AC signal may be any one of a sine wave, a triangular wave, a square wave, a trapezoidal wave, and a pulse wave. However, the disclosure is not limited thereto, and the AC signal may have various AC signal forms.

Figure 19:
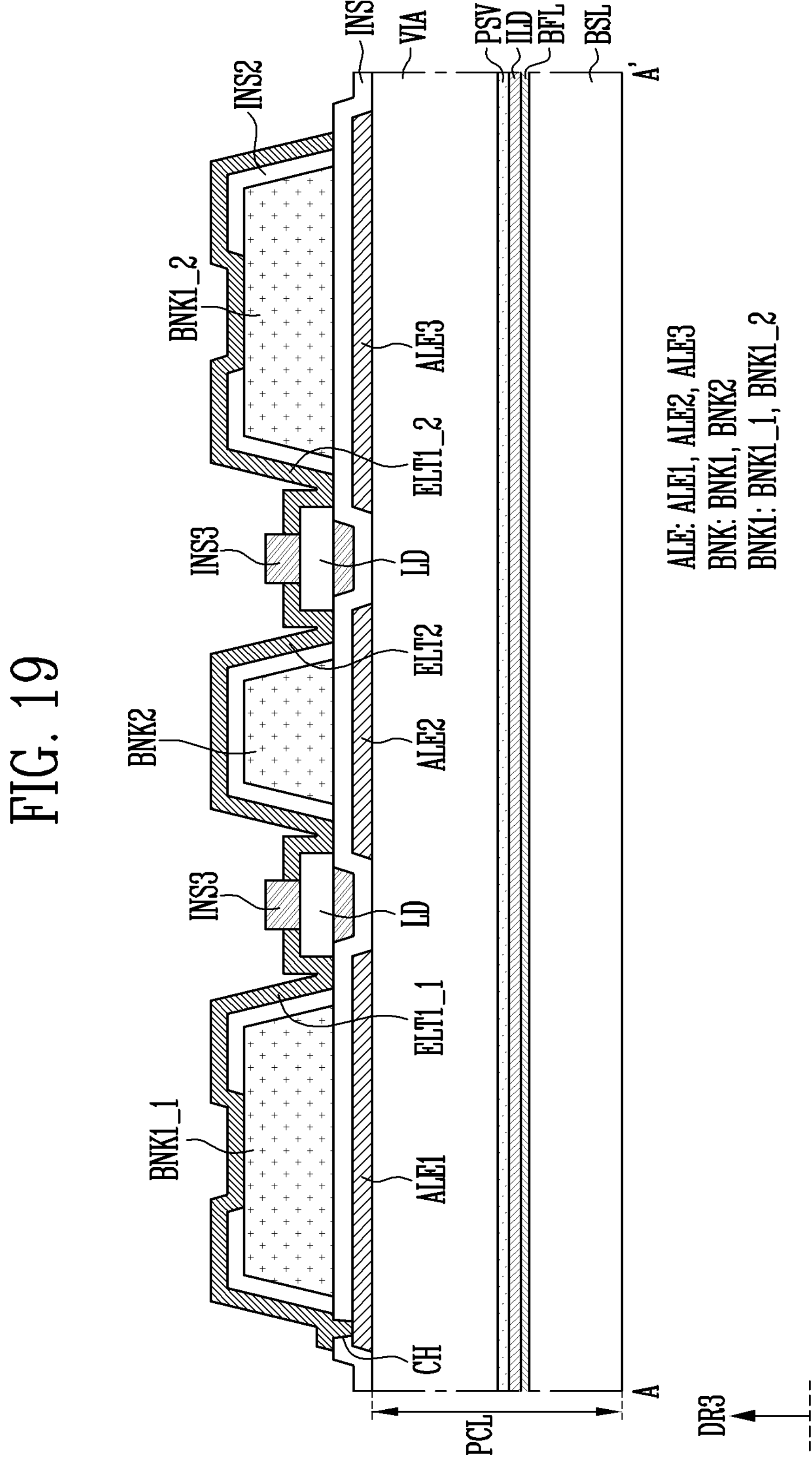

Referring to FIG. 19, the solvent SLV may be removed, and a third insulating layer INS3, a (1_1)th connection electrode ELT1_1, a (1_2)th connection electrode ELT1_2, and a second connection electrode ELT2 may be formed. The third insulating layer INS3 may be formed to overlap at least a portion (for example, an active layer 12) of the light emitting element LD, and a portion of the third insulating layer INS3 may be provided on a back surface of the light emitting element LD. The (1_1)th connection electrode ELT1_1 may be electrically connected to the first electrode ALE1 through the contact hole CH, and at least a portion of the (1_1)th connection electrode ELT1_1 may be electrically connected to one end of the light emitting element LD. The (1_2)th connection electrode ELT1_2 may be electrically connected to at least a portion of the light emitting element LD, and the second connection electrode ELT2 may be electrically connected to at least a portion of the light emitting element LD.

Subsequently, in an embodiment, a fourth insulating layer INS4, a color conversion layer CCL, an optical layer OPL, a color filter layer CFL, and the like may be formed, thereby providing the display device in accordance with an embodiment.

Figure 20:
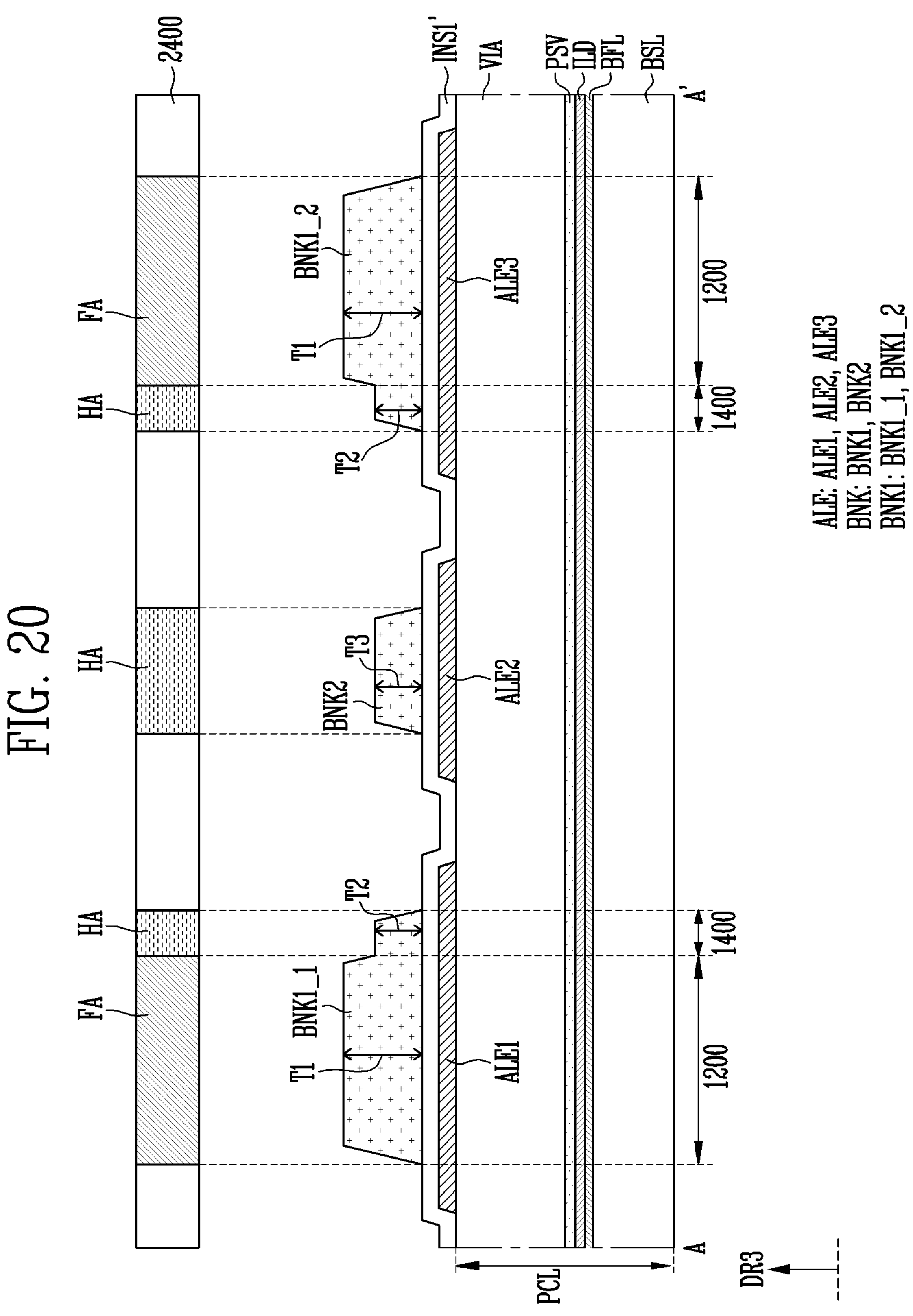
Figure 21:
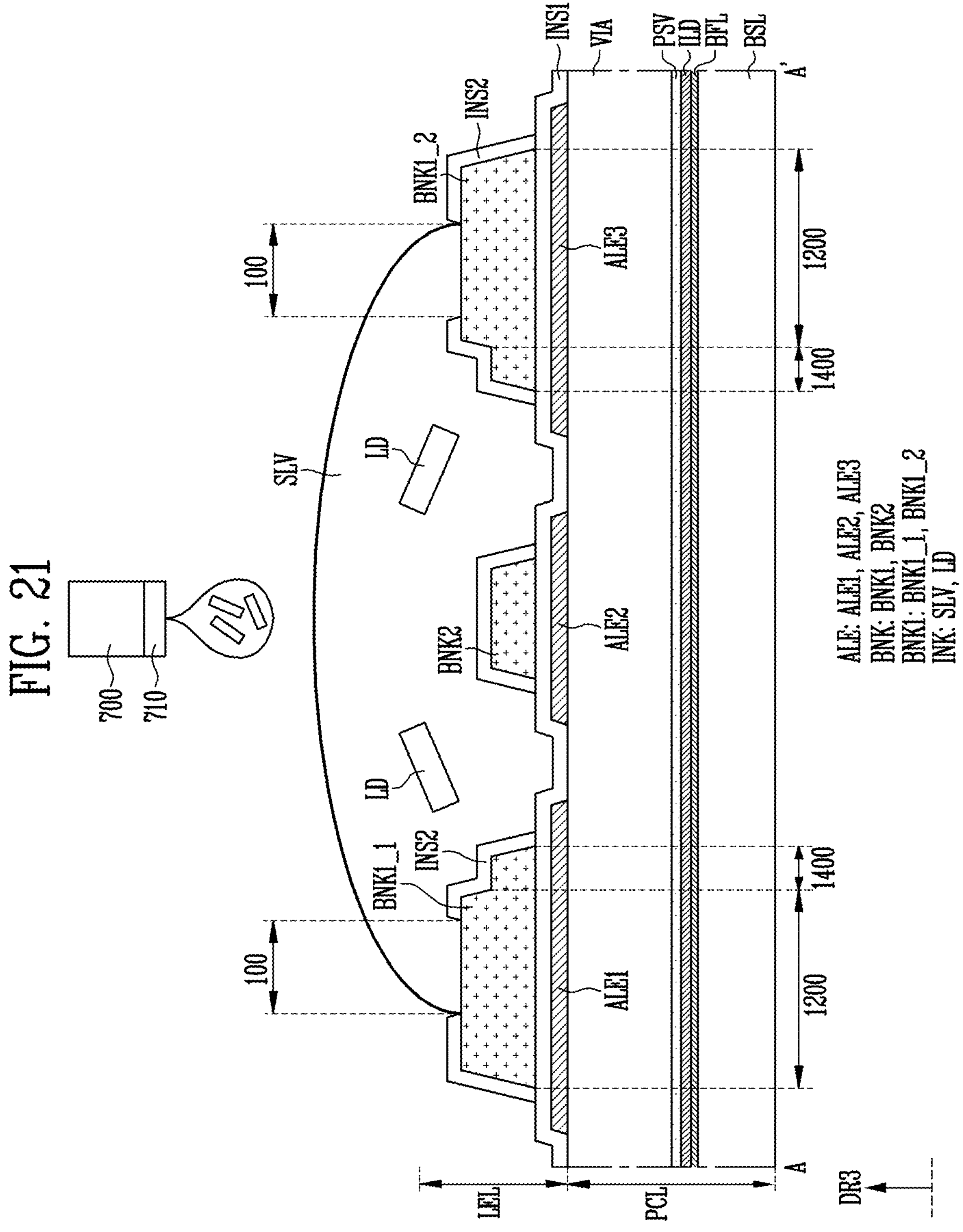

A manufacturing method for the display device in accordance with an embodiment will be described with reference to FIGS. 20 and 21. In FIGS. 20 and 21, descriptions of portions overlapping those described above will be simplified or will not be repeated.

FIGS. 20 and 21 are process sectional views schematically illustrating a manufacturing method for the display device in accordance with an embodiment. FIGS. 20 and 21 may be illustrated based on the sectional structure described above with reference to FIG. 11.

Referring to FIG. 20, a first bank BNK1 (for example, a (1_1)th bank BNK1_1 and a (1_2)th bank BNK1_2) including a first bank area 1200 and a second bank area 1400 and a second bank BNK2 may be formed on a first base insulating layer INS1'.

For example, a base bank layer (not shown) may be formed (or deposited) on the first base insulating layer INS1', and a photoresist layer may be formed on the base bank layer. A photoresist process may be performed by using a mask 2400 including a full-tone area FA and a half-tone area HA. Accordingly, at least a portion of the photoresist layer may be removed, and the photoresist layer may be provided as an etching mask including a full-tone part corresponding to the full-tone area FA and a half-tone area corresponding to the half-tone area HA. Subsequently, the base bank layer may be etched by using the etching mask, and accordingly, a bank BNK in accordance with an embodiment can be manufactured.

In accordance with an embodiment, at a position corresponding to the full-tone area FA, the etching of the base bank layer may not be substantially performed, or be performed relatively less than the half-tone area HA, so that the first bank area 1200 of the first bank BNK1, which has a first thickness T1, is provided. At a position corresponding to the half-tone area HA, the etching of the base bank layer may be performed relatively further than the full-tone area FA, so that the second bank area 1400 of the first bank BNK1, which has a second thickness T2, is provided. In an embodiment, at the position corresponding to the half-tone area HA, the etching of the base bank layer may be performed relatively further than the full-tone area FA, so that the second bank BNK2 having a third thickness T3 is provided.

A second base insulating layer INS2' may be formed, a first insulating layer INS1 and a second insulating layer INS2 may be provided by etching the first base insulating layer INS1' and the second base insulating layer INS2', and at least a portion of the first bank BNK may be exposed in an opening 100.

Referring to FIG. 21, as described above, an ink INK including light emitting elements LD may be provided. The ink INK may be substantially disposed in an area using, as an edge, an area corresponding to the opening 100. In accordance with an embodiment, the ink INK including the light emitting elements LD may be accommodated based on the opening 100 formed on the first bank area 1200 of the first bank BNK1. The light emitting elements LD may be superiorly disposed in an area in which the light emitting elements LD are to be disposed, based on a step difference according to the second bank area 1400 of the first bank BNK1. In accordance with this embodiment, the ink INK can be further supplied (or accommodated) by an amount corresponding to a thickness difference between the second bank area 1400 and the first bank area 1200.

Consequently, in accordance with an embodiment, the alignment degree of light emitting elements LD is enhanced, and thus the light emission efficiency of the pixel PXL can be improved.

In accordance with the disclosure, there can be provided a display device and a manufacturing method for a display device, in which an alignment degree of a light emitting element can be improved, and processes can be simplified.

Example embodiments have been disclosed herein, and although terms are employed, they are used and are to be interpreted in a generic and descriptive sense only and not for purposes of limitation. In some instances, as would be apparent to one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of skill in the art that various changes in form and details may be made without departing from the features and scope of the disclosure and as set forth in the following claims.

What is claimed is:

1. A display device comprising:

a first electrode and a second electrode disposed on a base layer;

a first insulating layer disposed on the first electrode and the second electrode;

a bank disposed on the first insulating layer and including an organic material;

a light emitting element disposed in an area surrounded by the bank;

a second insulating layer disposed on the bank; and a connection electrode electrically connected to the light emitting element, wherein:

the second insulating layer forms an opening exposing a surface of the bank, the surface of the bank is formed of the organic material, and the connection electrode is electrically connected to the first electrode through a contact hole penetrating the first insulating layer, and contacts the bank through the opening formed by the second insulating layer.

2. The display device of claim 1, wherein the opening surrounds at least a portion of the area including the light emitting element in a plan view.

3. The display device of claim 1, wherein the bank protrudes in a thickness direction of the base layer and forms a step difference adjacent to the area including the light emitting element.

4. The display device of claim 1, wherein the bank includes a first bank and a second bank, the opening overlaps the first bank, and does not overlap the second bank in a plan view, the first bank includes a (1_1)th bank and a (1_2)th bank, and the second bank is disposed between the (1_1)th bank and the (1_2)th bank.

5. The display device of claim 4, wherein the first bank includes a first bank area having a first thickness and a second bank area having a second thickness, the second thickness is less than the first thickness, and the second bank area is more adjacent to the light emitting element than the first bank area.

6. A display device comprising:

a first electrode and a second electrode disposed on a base layer;

a first insulating layer disposed on the first electrode and the second electrode;

a bank disposed on the first insulating layer;

a light emitting element disposed in an area surrounded by the bank; and a second insulating layer disposed on the bank, wherein the second insulating layer forms an opening exposing a surface of the bank, and at least a portion of the surface of the bank is recessed and forms a cavity in an area overlapping the opening formed by the second insulating layer in a plan view.

7. The display device of claim 6, wherein the cavity and the second insulating layer do not overlap each other in a plan view.

8. The display device of claim 1, wherein the second insulating layer includes an inorganic material.

9. The display device of claim 8, wherein the first insulating layer and the second insulating layer include a same material.

10. The display device of claim 1, wherein the bank comprises a first bank and a second bank adjacent to the light emitting element, and wherein a width of the first bank is different than a width of the second bank.

11. An electronic device comprising the display device of claim 1.

* * * * *